(12) United States Patent
Sone et al.

(10) Patent No.: US 7,829,971 B2
(45) Date of Patent: Nov. 9, 2010

(54) SEMICONDUCTOR APPARATUS

(75) Inventors: Hiroki Sone, Nukata-gun (JP); Akira Yamada, Nukata-gun (JP); Satoshi Shiraki, Toyohashi (JP); Nozomu Akagi, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 46 days.

(21) Appl. No.: 12/314,518

(22) Filed: Dec. 11, 2008

(65) Prior Publication Data
US 2009/0152668 A1 Jun. 18, 2009

(30) Foreign Application Priority Data

Dec. 14, 2007 (JP) ............................. 2007-323064
Apr. 23, 2008 (JP) ............................. 2008-112483

(51) Int. Cl.
*H01L 25/16* (2006.01)
*H01L 23/495* (2006.01)

(52) U.S. Cl. .............................. 257/501; 257/E25.029; 257/E23.031

(58) Field of Classification Search ................ 257/501, 257/668, 347, E25.029, E23.031, 199, 500, 257/503; 438/129, 125, 599
See application file for complete search history.

(56) References Cited

U.S. PATENT DOCUMENTS

| | | | |
|---|---|---|---|
| 5,442,223 A | 8/1995 | Fujii | |
| 6,013,936 A | 1/2000 | Colt, Jr. | |
| 6,992,363 B2 | 1/2006 | Akiyama et al. | |
| 7,205,587 B2 | 4/2007 | Fujimaki | |
| 7,285,455 B2 | 10/2007 | Fujimaki | |
| 7,462,913 B2 | 12/2008 | Muramoto et al. | |
| 2003/0094654 A1 | 5/2003 | Christensen et al. | |
| 2007/0090458 A1* | 4/2007 | Muramoto et al. | .......... 257/347 |
| 2009/0004772 A1 | 1/2009 | Jinbo et al. | |
| 2009/0152668 A1 | 6/2009 | Sone et al. | |

FOREIGN PATENT DOCUMENTS

| | | |
|---|---|---|
| JP | A-59-016341 | 1/1984 |
| JP | A-59-019350 | 1/1984 |
| JP | A-61-067253 | 4/1986 |
| JP | A-61-085853 | 5/1986 |

(Continued)

OTHER PUBLICATIONS

U.S. Appl. No. 12/654,707, filed Dec. 29, 2009, Senda et al.

(Continued)

*Primary Examiner*—Thomas L Dickey
*Assistant Examiner*—Nikolay Yushin
(74) *Attorney, Agent, or Firm*—Posz Law Group, PLC

(57) ABSTRACT

A semiconductor apparatus is disclosed. The semiconductor apparatus includes an SOI substrate including an active layer, a buried insulation film and a support substrate; a low potential reference circuit part located in the active layer and operable at a first reference potential; a high potential reference circuit part located in the active layer and operable at a second reference potential; a level-shifting element forming part located in the active layer and for providing a level-shift between the first and second reference potentials; and an insulation member insulating first and second portions of the support substrate from each other, wherein locations of the first and second portions respectively correspond to the low and high potential reference circuit parts.

22 Claims, 27 Drawing Sheets

FOREIGN PATENT DOCUMENTS

| | | |
|---|---|---|
| JP | A-61-121466 | 6/1986 |
| JP | A-01-241168 | 9/1989 |
| JP | A-02-271567 | 11/1990 |
| JP | A-02-281753 | 11/1990 |
| JP | A-04-062847 | 2/1992 |
| JP | A-10-125925 | 5/1998 |
| JP | B2-3076504 | 6/2000 |
| JP | A-2006-093229 | 4/2006 |
| JP | A-2006-287009 | 10/2006 |
| JP | A-2007-141958 | 6/2007 |

OTHER PUBLICATIONS

First Office Action issued from the Chinese Patent Office on Dec. 25, 2009 in the corresponding Chinese patent application No. 2008101843998 (with English translation).

Office Action mailed Oct. 6, 2009 in corresponding Japanese patent application No. 2007-323064 (and English translation).

* cited by examiner

SEMICONDUCTOR APPARATUS

CROSS REFERENCE TO RELATED APPLICATION

The present application is based on Japanese Patent Applications No. 2007-323064 filed on Dec. 14, 2007 and No. 2008-112483 filed on Apr. 23, 2008, the disclosures of which are incorporated herein by reference.

BACKGROUND OF THE INVENTION

1. Field of the Invention

The present invention relates to a semiconductor apparatus, more particularly to a semiconductor apparatus used as an element that controls an inverter for driving a motor or the like.

2. Description of Related Art

A high voltage integrated circuit (HVIC) is a semiconductor apparatus used as, for example, an element that controls power devices in an inverter for driving a load such as a motor or the like.

One example of a circuit for driving an inverter is described below with reference to FIG. 14. The circuit includes a first element 303, a second element 304, photocouplers 305a, 305b as level-shift elements 305a, 305b, and a control circuit 306. The first element can function as a high potential reference circuit part for driving insulated gate bipolar transistors (IGBTs) 302a provided in a high-side of an inverter circuit 301 for driving a motor 300. The second element can function as a low potential reference circuit part for driving IGBTs 302b provided in a low-side of the inverter circuit 301. The first element and the second element may be provided in different chips. The photocouplers 305a, 305b and the control circuit 306 are provided between the chips. In such a circuit, signals are transmitted through the photocouplers 305a, 305b to provide a level shift between the reference potentials of the high and low potential reference circuit parts.

Recently, because of the downsizing of an inverter, the above circuit has been integrated into a single chip or in other words, integrated into an HVIC. As shown in FIG. 15, an HVIC (i.e., semiconductor apparatus) 406 includes a high potential reference circuit part 403 and a low potential reference circuit part 404, which are for use in controlling IGBTs 402a, 402b of an inverter circuit 401 for driving a motor 400. The HVIC 406 further includes a level-shifting element 405 having a high breakdown voltage (e.g., LDMOS: lateral diffused metal oxide semiconductor element).

The HVIC 406 formed in a single chip has, however, a difficulty associated with potential interference between the high and low potential reference circuit parts 403, 404. Such interference causes an improper operation in the circuit. Because of the above difficulty, element isolation is made by using a junction isolation (JI) structure, a dielectric isolation structure, or a trench isolation structure with silicon on insulator (SOI) substrate (c.f., JP-A-2006-93229). However, in any one of the above-described element isolation structures, when the level is shifted from a low potential such as 0V to a high potential such as 750V, a higher potential (e.g., a potential exceeding 1200 V) generates at a large rise rate of a few tens kV/µsec, resulting in a large amplitude of potential. It is difficult to treat the above high voltage surge having the high rise rate without involving circuit malfunction. Herein, such high voltage surge having a high rise rate is referred to as a dv/dt surge since an increase in the voltage with the rise time is large. In particular, the above dv/dt surge becomes a problem in a circuit having a noise-sensitive analog-element since failure notably occurs in such a circuit more than in a logic circuit.

Discussion is given below in connection with the above points, as the related art. Out of the above-described element isolation structures, the trench isolation structure with the SOI substrate may have high resistance to noise. For element isolation, the trench isolation structure may be high potential one. However, in developing a level-shifting element with the trench isolation structure, the inventors has revealed following difficulties. When a dv/dt surge is applied in an HVIC having a trench isolation structure with a SOI substrate, potential is interfered through a support substrate, generating a displacement current that charges or discharges a parasitic capacitance formed in a buried oxide (BOX) layer between the support substrate and an active layer (i.e., an SOI layer). As a result, the circuit may improperly operate. FIG. 25 is a cross sectional diagram illustrating generation of a displacement current in an HVIC where high and low electric potential reference circuit parts HV, LV are formed in an SOI layer 511. As shown in FIG. 25, for example, a displacement current generates and flows (i) from a virtual GND potential part of the high electric potential reference circuit part HV via a buried layer 513 (i.e., box layer) into a support base 512, and (ii) flows from the support base 512 via again the buried layer 513 into a GND potential part of the low electric potential reference circuit part LV.

The above difficulties may be suppressed by reducing propagation of the displacement current in such a manner that the BOX layer is made thicker to decrease a parasitic capacitance, or an impurity concentration on a support substrate 512 side is made smaller to increase a resistance. However, when an amplifier circuit having a high amplification rating is integrated for instance, a slight displacement current can become a factor for improper operation.

SUMMARY OF THE INVENTION

In view of the above and other difficulties, it is an objective of the present invention to provide a semiconductor apparatus capable of suppressing generation of a displacement current and capable of restricting a circuit improper operation.

According to a first aspect of the present invention, a semiconductor apparatus is provided. The semiconductor apparatus includes an SOI substrate 104 having an active layer, a buried insulation film and a support substrate. The active layer and the support substrate are bonded through the buried insulation film. The semiconductor apparatus further includes a low potential reference circuit part and a high potential reference circuit part in the active layer. The high potential reference circuit part is operable at a second reference potential, which is greater than or equal to the first reference potential. The semiconductor apparatus further includes a level-shifting element forming part in the active layer and having a level-shifting element providing a level-shift between the first reference potential and the second reference potential. The semiconductor apparatus further includes an insulation member insulating a first portion and a second portion of the support substrate from each other. A location of the first portion corresponds to the low potential reference circuit part, and a location of the second portion corresponds to the high potential reference circuit part.

According to the above semiconductor apparatus, it is possible to suppressing displacement current generation caused by, for example, a dv/dt surge. It is possible to restrict circuit improper operation.

According to a second aspect of the present invention, a semiconductor apparatus is provided. The semiconductor apparatus includes a semiconductor layer having a front surface and a back surface. The semiconductor layer includes a low potential reference circuit part operable at a first reference potential; a high potential reference circuit part operable at a second reference potential, which is greater than or equal to the first reference potential; and a level-shift element forming part having a level-shift element providing a level-shift between the first and second reference potentials. The semiconductor apparatus further includes an insulating member on first and second portions of the back surface of the semiconductor layer, which respectively correspond to the low and high potential reference circuit parts. The semiconductor apparatus further includes a first conductive member located opposite to the low potential reference circuit part with respect to the insulating member, and electrically connected with a first region of the low potential reference circuit part. The first reference potential is applied to the first region. The semiconductor apparatus further includes a second conductive member located opposite to the high potential reference circuit part with respect to the insulating member, and electrically connected with a second region of the high potential reference circuit part. The second reference potential is applied to the second region.

According to the above semiconductor apparatus, it is possible to suppress displacement current generation caused by, for example, a dv/dt surge. It is possible to restrict circuit improper operation.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EXEMPLARY EMBODIMENTS

Exemplary embodiments are described below with reference to the accompanying drawings.

First Embodiment

Figure 2:
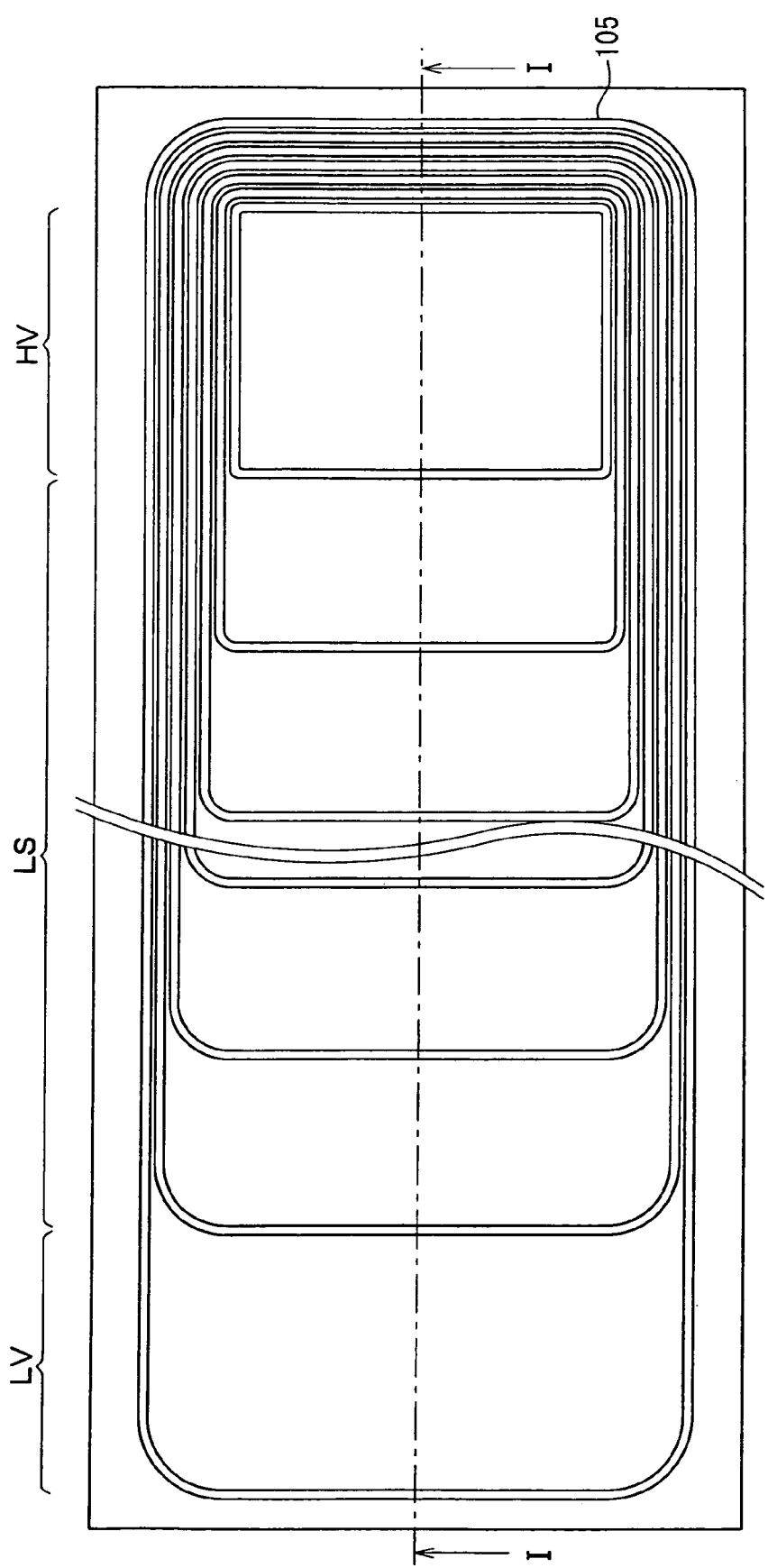
FIG. 2 is a diagram illustrating a layout of elements on a front surface side of the semiconductor apparatus illustrated in FIG. 1.
Figure 3:
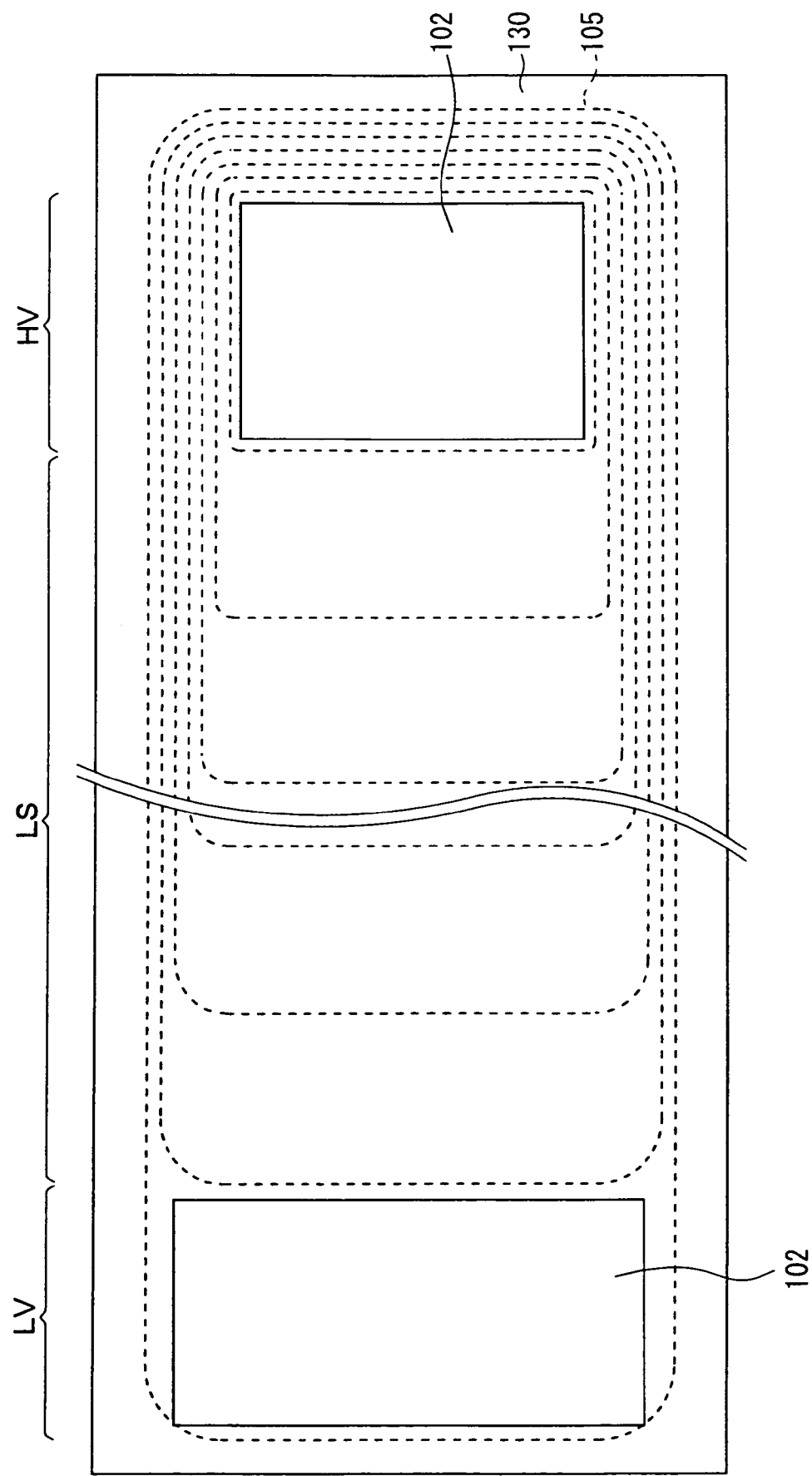
FIG. 3 is a diagram illustrating a layout of elements on a rear surface side of the semiconductor apparatus illustrated in FIG. 1.

A configuration of a semiconductor apparatus of a first embodiment is described below with reference to FIGS. 1 to 3. In the following description, it is assumed that a front surface side of a semiconductor apparatus corresponds to one described in an upper side of FIG. 1, and a rear surface side of the semiconductor apparatus corresponds to one described in a lower side of FIG. 1.

Figure 1:
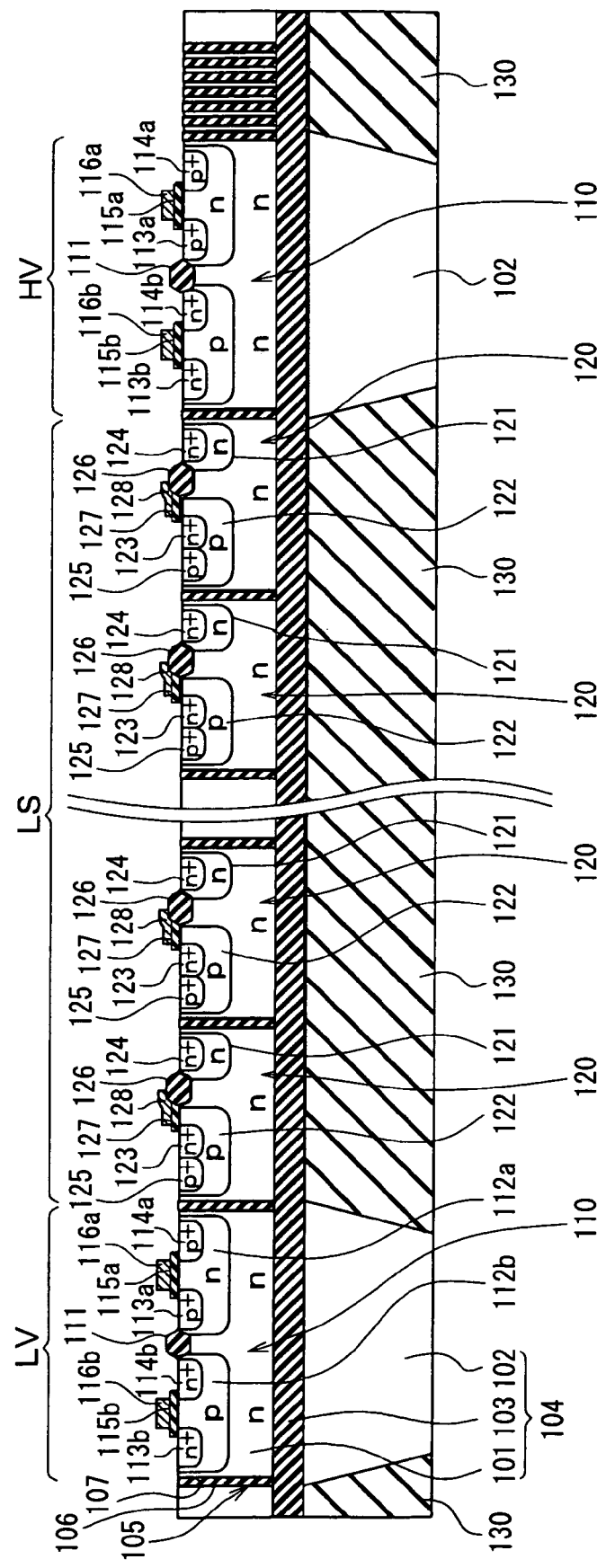
FIG. 1 is a cross sectional diagram taken along line I-I in FIG. 2 and illustrating a semiconductor apparatus in accordance with a first embodiment.

As shown in FIG. 1, the semiconductor apparatus is formed by using a silicon on insulator SOI substrate 104, which includes a support substrate 102 and an SOI layer 101 bonded through a buried oxide film 103. The SOI layer 101 is made of, for example, P type silicon. The SOI layer 101 functions as an active layer 101. The buried oxide film 103 functions as a buried insulation film 103.

The SOI layer 101 is located on the front surface side of the semiconductor apparatus and is formed by grinding a silicon substrate to a predetermined thickness. In the SOI layer 101, multiple trench isolation members 105 separates elements from each other. Each trench isolation member 105 includes a trench 106 and an insulation film 107 located inside the trench 106. The trench 106 extends from the front surface of the SOI layer 101 to the buried oxide film 103. The multiple trench isolation members 105 may have a substantially same width.

The multiple trench isolation members 105 are arranged in a multiple ring pattern. A low potential reference circuit part LV, which corresponds to a region illustrated in a left-hand side of FIGS. 1 to 3, is in a region between an outermost trench isolation member 105 and a trench isolation member 105 adjacent to the outermost trench isolation member 105. A high potential reference circuit part HV, which corresponds to a region illustrated in a right-hand side of FIGS. 1 to 3A, is in a region located inside an innermost trench isolation member 105. A level-shifting element forming region LS is located between the high and low potential reference circuit parts HV and LV.

The low potential reference circuit part LV of the SOI layer 101 includes a signal processing circuit, which is a logic circuit for instance and driven by a low potential. The low potential reference circuit part LV is separated from other parts of the semiconductor apparatus by the trench isolation members 105. The low potential reference circuit part LV includes various elements (e.g., a CMOS 110), which are elements of the signal processing circuit. More specifically, an insulation layer 111 separates elements from each other in the SOI layer 101. The insulation layer 111 may be provided by a shallow trench isolation (STI), a local oxidation of silicon (LOCOS) layer, or the like. Separated regions include, for example, an N well layer 112a and a P well layer 112b. A P+ type source region 113a and a P+ type drain region 114a are located in the N well layer 112a. An N+ type source region 113b and an N+ type drain region 114b are located in the P well layer 112b. Through a gate insulation film 115a, a gate electrode 116a is located above a surface of the N well layer 112a, which surface is positioned between the P+ type source region 113a and the P+ type drain region 114a. Through a gate insulation film 115b, a gate electrode 116b is located above a surface of the P well layer 112b, which surface is positioned between the N+ type source region 113b and the N+ type drain region 114b. Accordingly, there is provided a CMOS 110 having an N channel MOSFET and a P channel MOSFET.

The low potential reference circuit part LV includes a line element (not shown) and a interlayer insulation film (not shown), which are located on the front surface side of the SOI layer 101. The line element is electrically connected with elements of the CMOS 110, including each gate electrode 116a, 116b, each source region 113a, 113b, and each drain region 114a, 114b. The low potential reference circuit part LV may further include a bipolar transistor, a diffusion resistor, a memory, or the like (not shown).

The high potential reference circuit part HV includes a signal processing circuit, which is a logic circuit for instance and is driven by a high potential. The high potential reference circuit part HV is separated from other parts of the semiconductor apparatus by the trench isolation members 105. The high potential reference circuit part HV includes a CMOS 110, a configuration of which is substantially identical to that in the low potential reference circuit part LV. The high potential reference circuit part HV may further include a bipolar transistor, a diffusion resistor, a memory, or the like (not shown).

The level-shifting element forming part LS includes a lateral diffused metal oxide semiconductor (LDMOS) 120 as a level-shifting element 120 having a high breakdown voltage. In a surface portion of the SOI layer 101, the LDMOS 120 has an N type drain region 121, a P type channel region 122, and an N+ type source region 123. An N+ type contact layer 124 is formed in a surface portion of the N type drain region 121. A P+ type contact layer 125 is formed in a surface portion of the P type channel region 122. The N type drain region 121 and the P type channel region 122 are separated from each other by a LOCOS oxidation layer 126. A gate electrode 128 is located above the P type channel region 122 through a gate insulation film 127. Accordingly, there is provided the LDMOS 120 having a high breakdown voltage.

On the front surface side of the SOI layer 101, a line element (not shown) and an interlayer insulation film (not shown) are formed. The line element is electrically connected with the gate electrode 128, the N+ type source region 123 and the P+ type contact layer 125, or the N+ type contact layer 124.

Multiple cells for the LDMOS 120 having the above-described configuration and a high breakdown voltage are formed between the low and high potential reference parts LV and HV. The multiple cells are separated from each other by the trench isolation members 105.

The support substrate 102 is made of a silicon substrate. As shown in FIGS. 1 and 3, the support substrate 102 remains in only places that respectively correspond to the low and high potential reference circuit parts LV, HV. An insulation member 130 is embedded in a space where the support substrate is removed. The insulation member 130 is made of a low permittivity material, which is for example resin (e.g., epoxy resin) for use in encapsulation.

In the semiconductor apparatus, the support substrate 102 have a first portion below the low potential reference circuit part LV and a second portion below the high potential reference circuit part HV. The first portion and second portion of the support substrate 102 are insulated from each other by the insulation member 130. Accordingly, it is possible to suppress potential propagation between the first portion and the second portion of the support substrate 102. This results in reduction of a potential difference between the SOI layer 101 and the support substrate 102. It is therefore possible to suppress generation of a displacement current that charges or discharges a parasitic capacitance, and restrict improper operation in a circuit.

Although the insulation member 130 insulates the first portion and second portion of the support substrate 102 from each other, there may appear a parasitic capacitance that depends on the permittivity of the insulation member 130. Since the first portion and second portion of the support substrate 102 are spaced away a large distance from each other, the parasitic capacitance is remarkably small, the generation of a displacement current can be substantially suppressed. Nevertheless, it may be preferable that the insulation member 130 is made of a material with permittivity as low as possible since the parasitic capacitance depends on the permittivity of the insulation member 130.

The above-described semiconductor device can be manufactured through the following manners. Elements of the low potential reference circuit part, elements of the high potential reference circuit part HV and element of the level-shifting element forming region LS are formed. The support substrate 102 is partially removed. Then, the insulation member 130 is embedded in a place where a removed portion of the support substrate 102 had existed.

Referring to FIGS. 4A to 4E, a method for manufacturing a semiconductor apparatus is more specifically described below. FIGS. 4A to 4E are cross sectional diagrams each illustrating a manufacturing process of a semiconductor apparatus with encapsulation resin in accordance with the present embodiment. For simplicity, FIG. 4A to 4E do not show elements formed in the SOI layer 101.

Figure 4D:
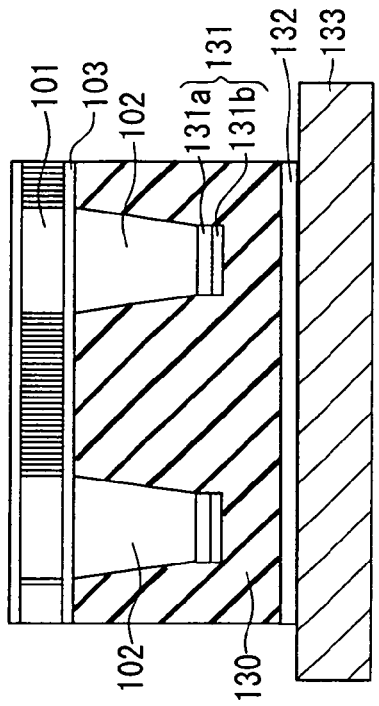
FIGS. 4A to 4E are cross sectional diagrams illustrating processes of manufacturing a semiconductor apparatus with encapsulation resin in accordance with a first embodiment.
Figure 4E:
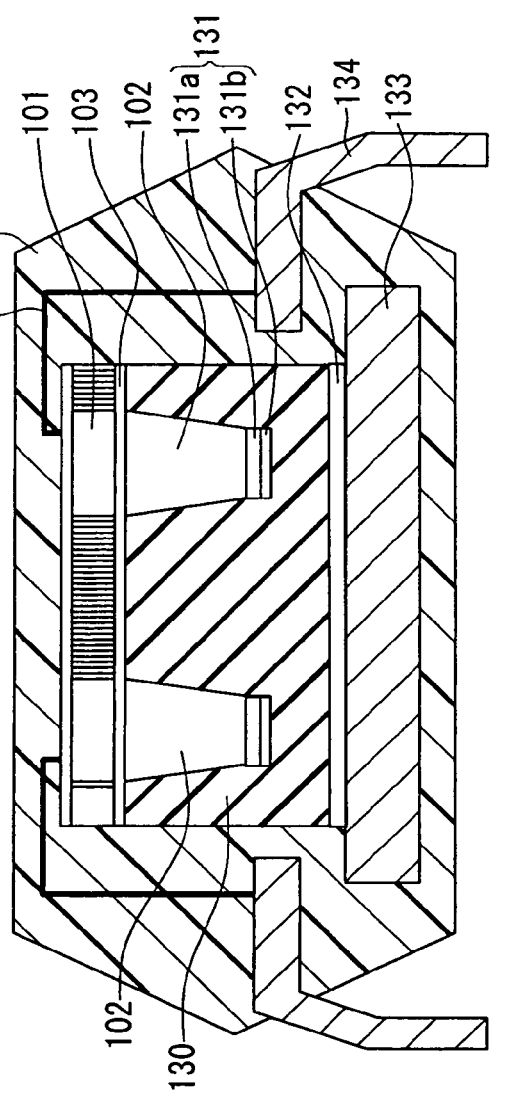
Figure 4A:
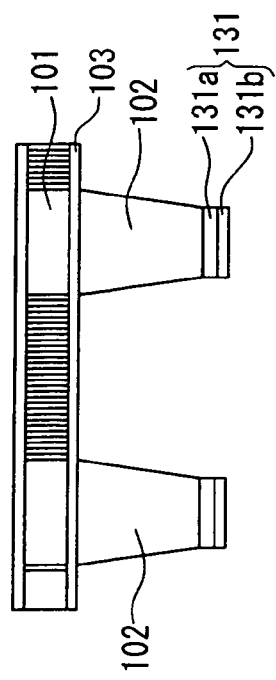

As shown in FIG. 4A, a rear surface of the support substrate 102 is polished after formation of elements of the low and low potential reference circuit parts LV, HV and elements of the level-shifting element forming part LS. A mask 131 having a silicon oxide film 131a and a silicon nitride film 131b is placed on the polished rear surface of the support substrate 102. By using the mask 131, the support substrate 102 is partially removed by etching. The above process may be performed by wet-etching that employs KOH solution with high selectivity in the oxide layer and another. The KOH solution employed may be similar to that used in a process for forming a diaphragm of a pressure sensor or the like.

Figure 4B:
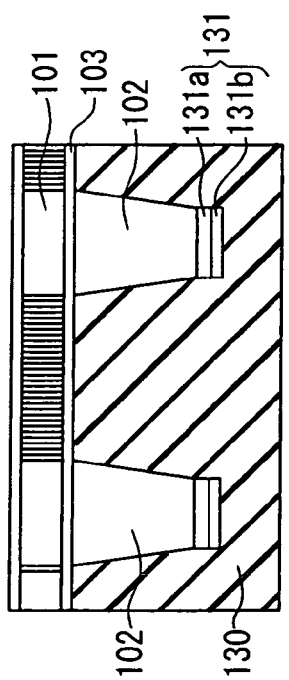
Figure 4C:
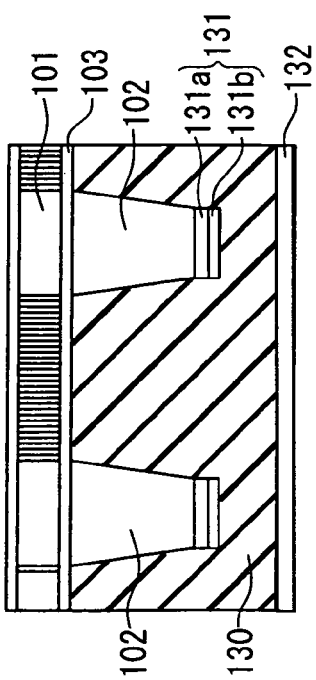

As shown in FIG. 4B, an insulation member 130 is so applied to cover the support substrate 102 and a region where the removed part of the support substrate had exist. As shown in FIG. 4C, a die bond film 132 is placed on a surface of the insulation member 130. Then, as shown in FIG. 4D, a semiconductor apparatus is bonded to a lead frame 133 through the die bond film 132. As shown in FIG. 4E, an external connection terminal 134 is electrically connected with a predetermined portion of the semiconductor apparatus by using a bonding wire 135. The semiconductor apparatus, the lead frame 133 and a part of the external connection terminal 134 are covered by an encapsulation resin member 136. Through the above manners, the semiconductor apparatus with encapsulation resin can be manufactured.

As shown in FIGS. 4A to 4E, the support substrate 102 is fully covered by the insulation member 130. Alternatively, after the insulation member 130 is applied, the insulation member 130 may be grinded until the support substrate 102 is exposed, so that the insulation member 130 remains in the space where the removed portion of the support substrate 102 had exist.

The inventors carried out simulations such that the semiconductor apparatus is connected to an inverter circuit (not shown) for driving a motor. More specifically, the simulations treats a case where voltage for level-shifting is input as such a rectangular wave that the voltage is switched between 0V and 750V at given time intervals to provide a level-shift of the reference potential of the high and low electric reference circuit parts HV and LV. In application of the voltage for level-shifting, it is expected that, at a moment of voltage switch from 0V to 750V, a voltage can instantaneously overshoots 750 V and reaches between 1200 V and 1300 V, causing a large dv/dt surge. The inventors studied a displacement current for a case of the dv/dt surge and obtained results shown in FIG. 5.

Figure 5:
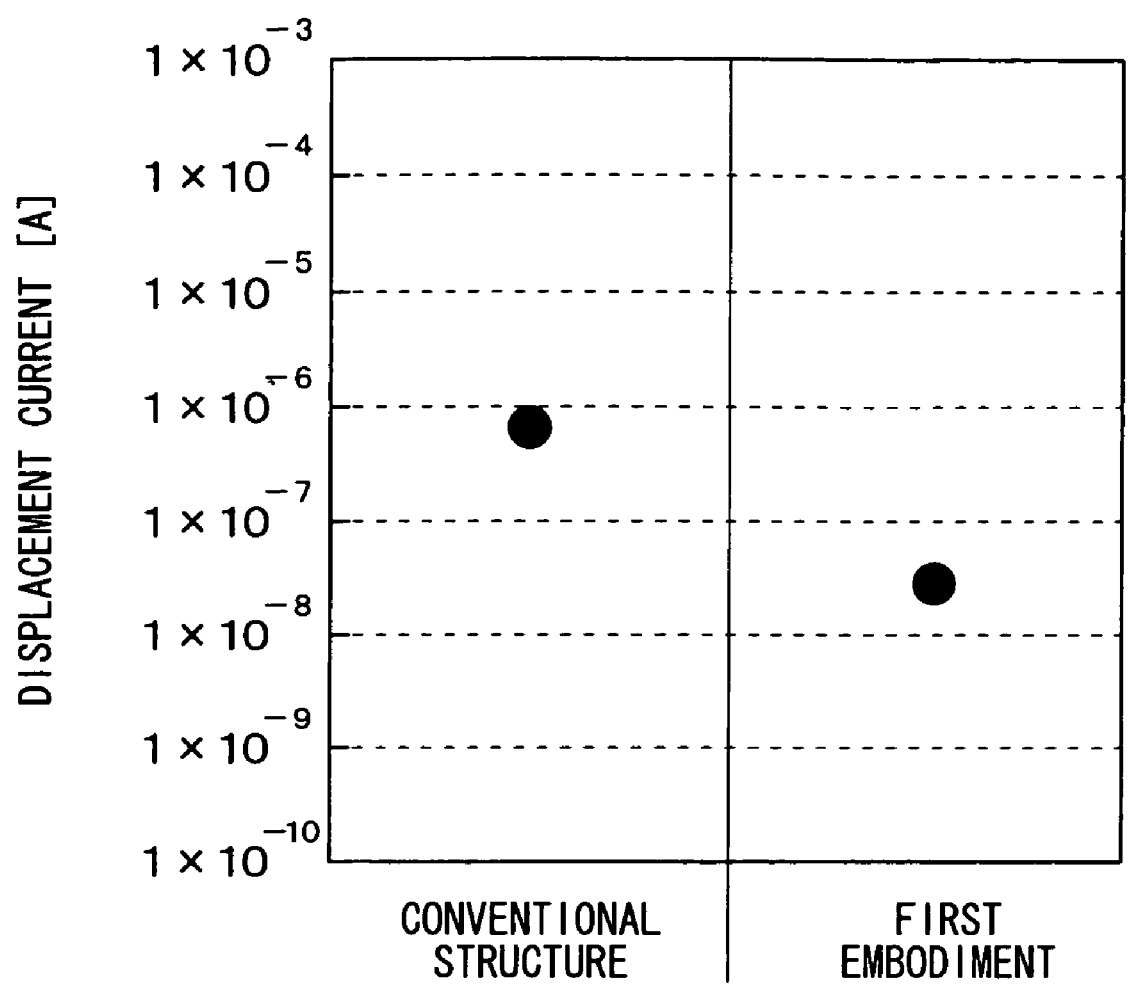
FIG. 5 is a graph showing displacement currents for a case of dV/dt surge in a first embodiment and a conventional structure.

As shown in FIG. 5, the displacement current in the semiconductor device of the present embodiment is smaller that of a conventional configuration by two orders of magnitude. It should be noted that the semiconductor apparatus of the conventional configuration has a support substrate 102, which is monolithic and is not divided into pieces. The simulations also demonstrate that the semiconductor apparatus of the present embodiment can restrict the displacement current and have the above-described advantages.

Second Embodiment

A difference between a semiconductor apparatus of the present embodiment and that of a first embodiment includes a configuration for setting a potential of the support substrate 102.

Figure 6:
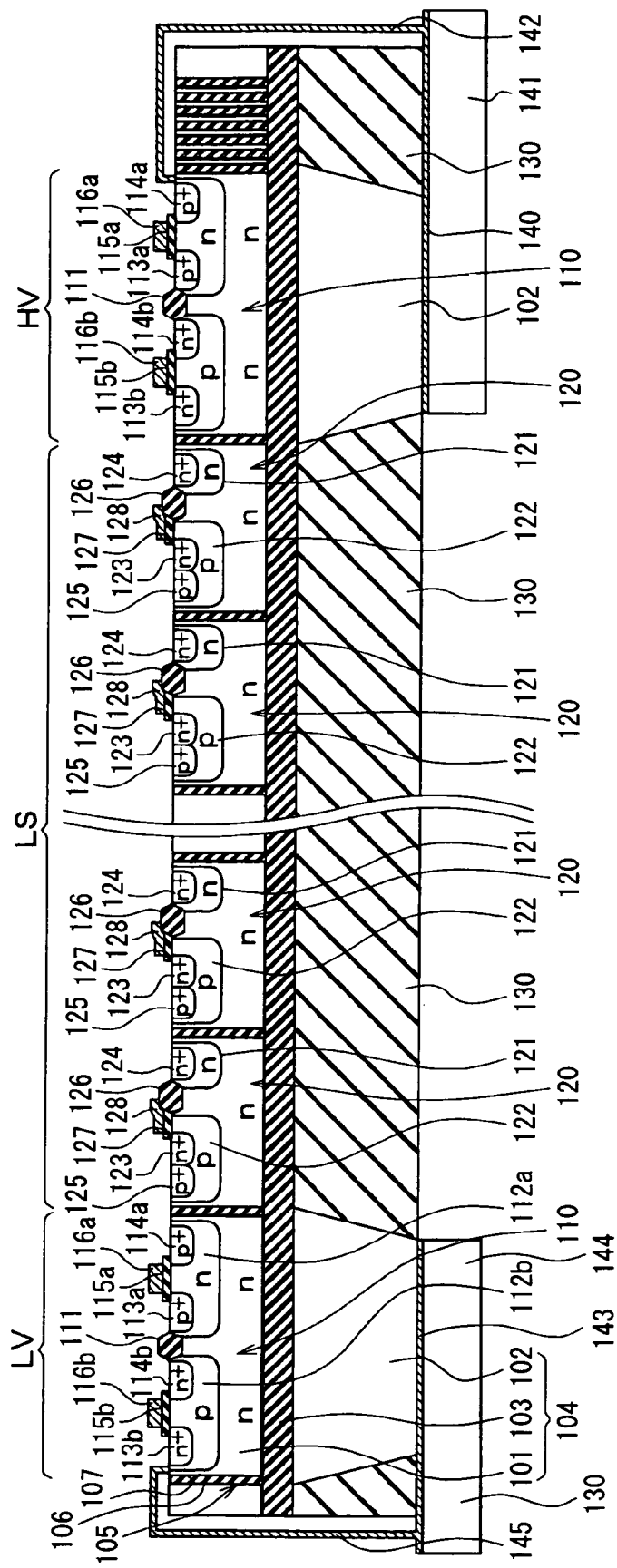
FIG. 6 is a cross sectional diagram illustrating a semiconductor apparatus in accordance with a second embodiment.

FIG. 6 is a cross sectional diagram illustrating a semiconductor apparatus (i.e., HVIC) in accordance with the present embodiment. As shown in FIG. 6, the semiconductor apparatus has a second terminal (not shown) for receiving the reference potential of the high potential reference circuit part HV. The second terminal and the second portion of the support substrate 102 are electrically connected with each other so as to have a substantially same potential. The second portion of the support substrate 102 is located at a place corresponding to the high potential reference circuit part HV, or in other words, the second portion is located opposite to the high potential reference circuit part HV with respect to the buried oxide film 103. More specifically, a base 141 having a conductive pattern 140 is bonded to a rear surface of the second portion of the support substrate 102. The conductive pattern 140 is electrically connected with the second terminal through a wire 142.

The semiconductor apparatus has a first terminal (not shown) for receiving the reference potential of the low potential reference circuit part LV in the SOI layer 101. The first terminal and the first portion of the support substrate 102 are electrically connected with each other so as to have a substantially same potential. The first portion of the support substrate 102 is located at a place corresponding to the low potential reference circuit part LV, or in other words, the first portion is located opposite to the low potential reference circuit part LV with respect to the buried oxide film 103. More specifically, a base 144 having a conductive pattern 143 is bonded to a rear surface of the first portion of the support substrate 102. The conductive pattern 143 is electrically connected with the second terminal through a wire 145.

In the above configuration, the second portion of the support substrate 102 and the high potential reference circuit part HV can have a substantially same potential, and the first portion of the support substrate 102 and the low potential reference circuit part LV can have a substantially same potential. That is, corresponding regions on both sides of the buried oxide film 103 can have a substantially same potential. It is therefore possible to more efficiently restrict generation of a displacement current.

A difference between a method for manufacturing the semiconductor apparatus of the present embodiment and that of a first embodiment includes a process of electrically connecting the support substrate 102 and the conductive pattern 140, 143.

FIGS. 7A to 7E are cross sectional diagrams illustrating a method for manufacturing a semiconductor apparatus with encapsulation resin in accordance with the present embodiment. A method for manufacturing a semiconductor apparatus is described below with reference to FIGS. 7A to 7E. For simplicity, FIGS. 7A to 7E do not show elements formed in the SOI layer 101.

Figure 7A:
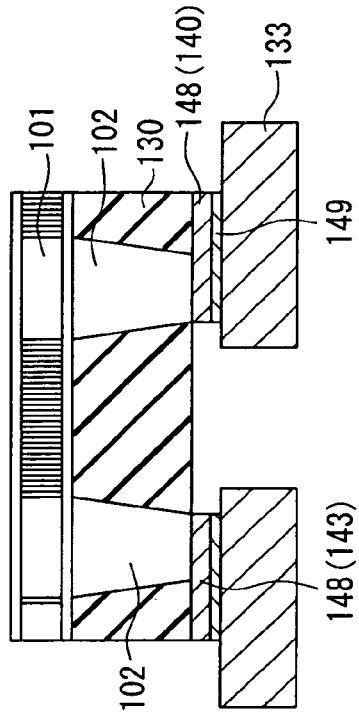
FIGS. 7A to 7E are cross sectional diagrams illustrating processes of manufacturing a semiconductor apparatus with encapsulation resin in accordance with a second embodiment.
Figure 7B:
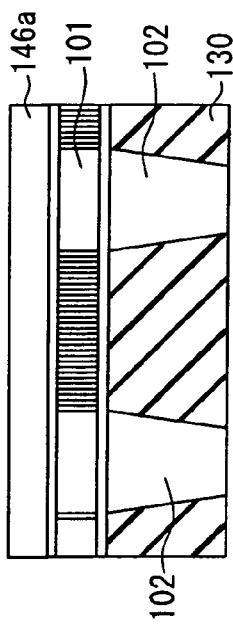
Figure 7C:
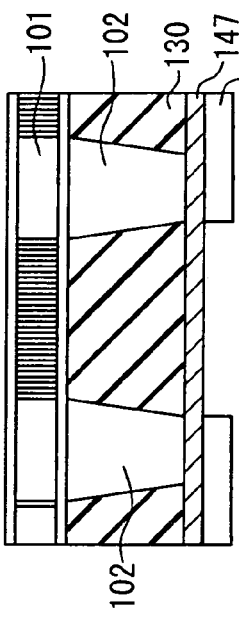

First, a process corresponding to that illustrated in FIG. 4A is performed. Then, as shown in FIG. 7A, a surface of the semiconductor apparatus on the front surface side is protected with a resist 146a. A resin for the insulation member 130 is etched, and then, a mask 131 is etched. Then, as shown in FIG. 7B, after removing the resist 146a, a metal layer 147 is deposited on the rear surface of the support substrate 102. A mask 148 for use in pattering the metal layer 147 is placed. Then, as shown in FIG. 7C, the surface on the SOI layer 101 side is protected again with a resist 146b. The metal layer 147 is patterned by using the mask 148. Through the above manners, the conductive pattern 140 is formed that is provided by the metal layer 147, and that is electrically connected with the second portion of the support substrate 102. Also, the conductive pattern 143 is formed that is provided by the metal layer 147, and that is electrically connected with the first portion of the support substrate 102.

Figure 7D:
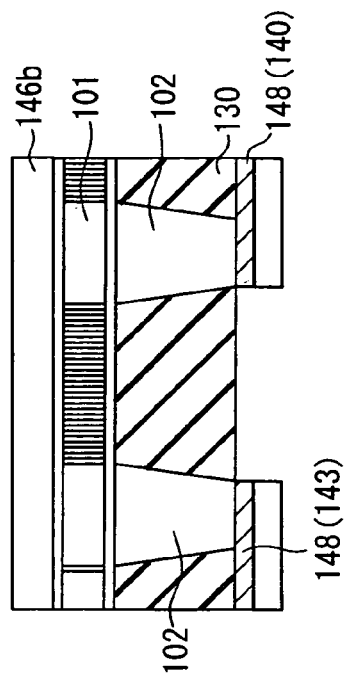
Figure 7E:
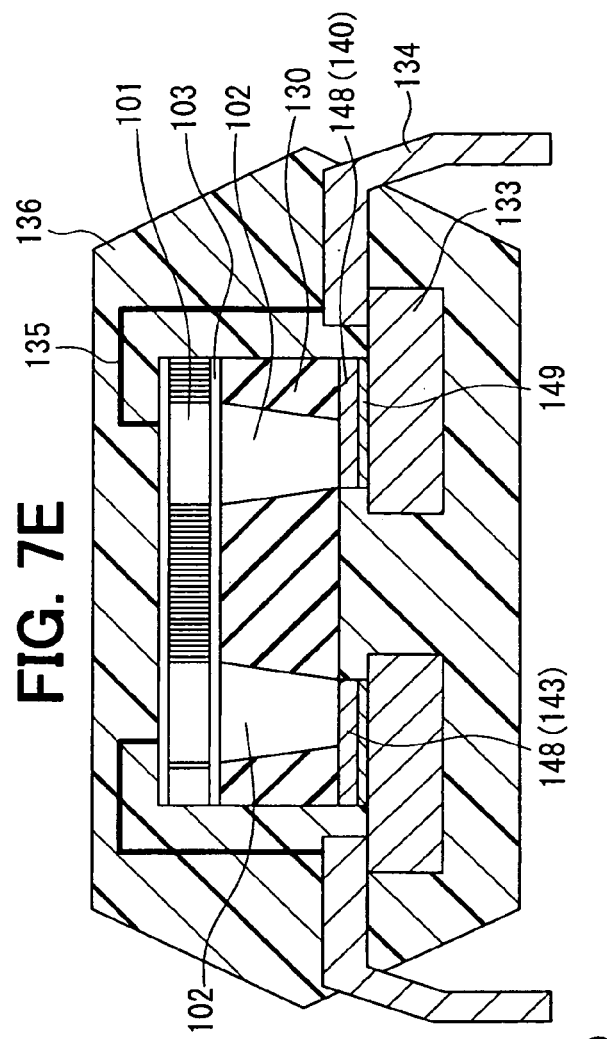

Then, as shown in FIG. 7D, after removing the mask 148 and the resist 146b, the conductive patterns 140, 143 are electrically connected to a lead frame 133 for the bases 141, 144 through a solder 149. Then, as shown in FIG. 7E, an external connection terminal 134 is electrically connected to a predetermined part of the semiconductor apparatus through the bonding wire 135. The lead frame 133 is electrically connected to the external connection terminal 134, which is electrically connected with one of the high and low potential reference circuit parts HV, LV through the bonding wire 135. Through the external connection terminal 134 and the lead frame 133, the high potential reference portion HV and the second portion of the support substrate 102 can have a substantially same potential, and the low potential reference portion LV and the first portion of the support substrate 102 can have a substantially same potential. That is, corresponding regions on both sides of the buried oxide film 103 can have a substantially same potential. Then, the encapsulation resin member 136 covers the semiconductor apparatus, the lead frame 133, a part of the external connection terminal. Through the above manners, it is possible to manufacture the semiconductor apparatus with encapsulation resin according to the present embodiment.

Figure 8:
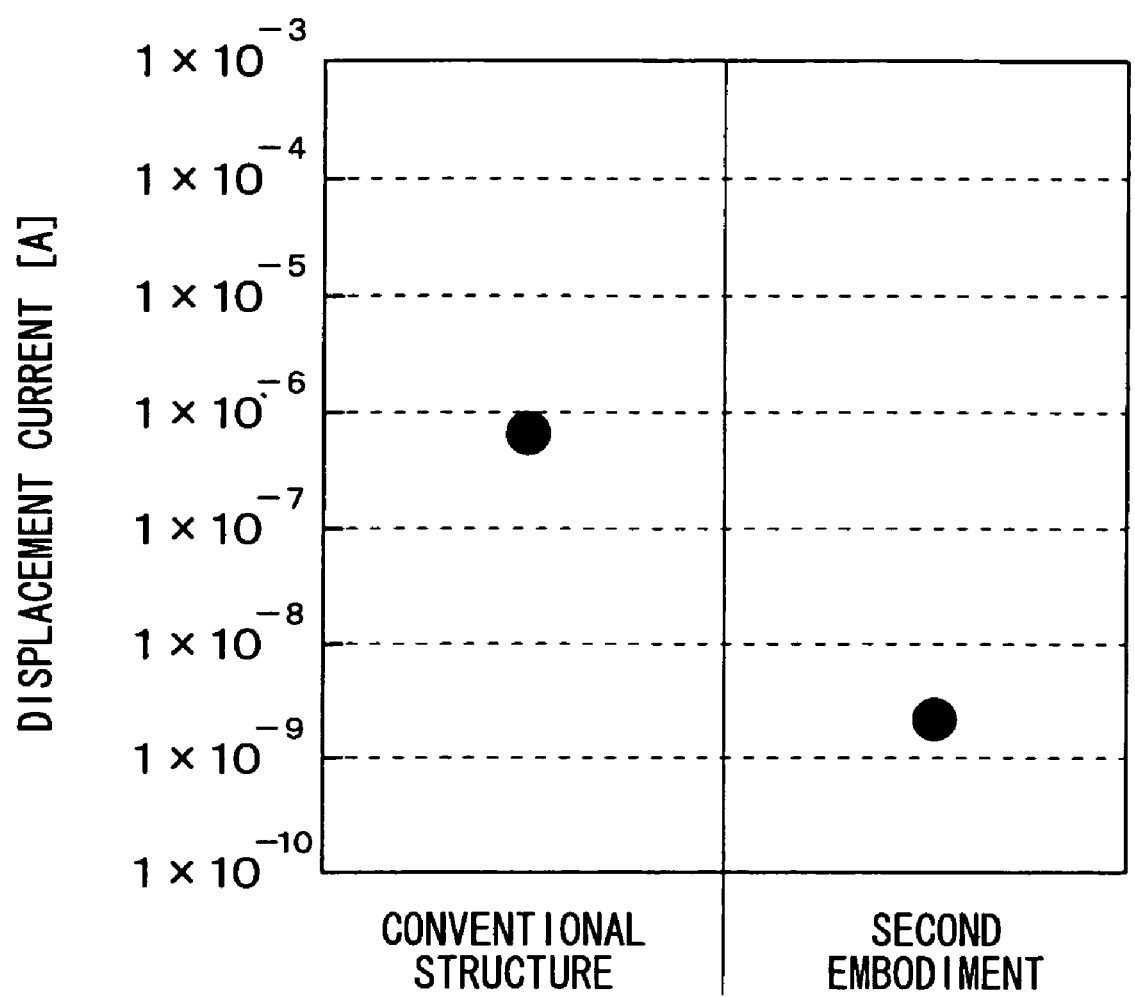
FIG. 8 is a graph showing displacement currents for a case of dV/dt surge in accordance with a second embodiment and a conventional configuration.

Simulations were carried out in a similar way to that described in a first embodiment. The results are shown in FIG. 8, which indicates that the semiconductor apparatus of the present embodiment can restrict generation of the displacement current more efficiently than that of a first embodiment. The displacement current is smaller than that of a conventional configuration by roughly three orders of magnitude.

Third Embodiment

A difference between a semiconductor apparatus of the present embodiment and that of a first embodiment includes arrangement of the support substrate 102. In the present embodiment, the support substrate 102 has a third portion, which is located on a place corresponding to an element-outside part.

Figure 9:
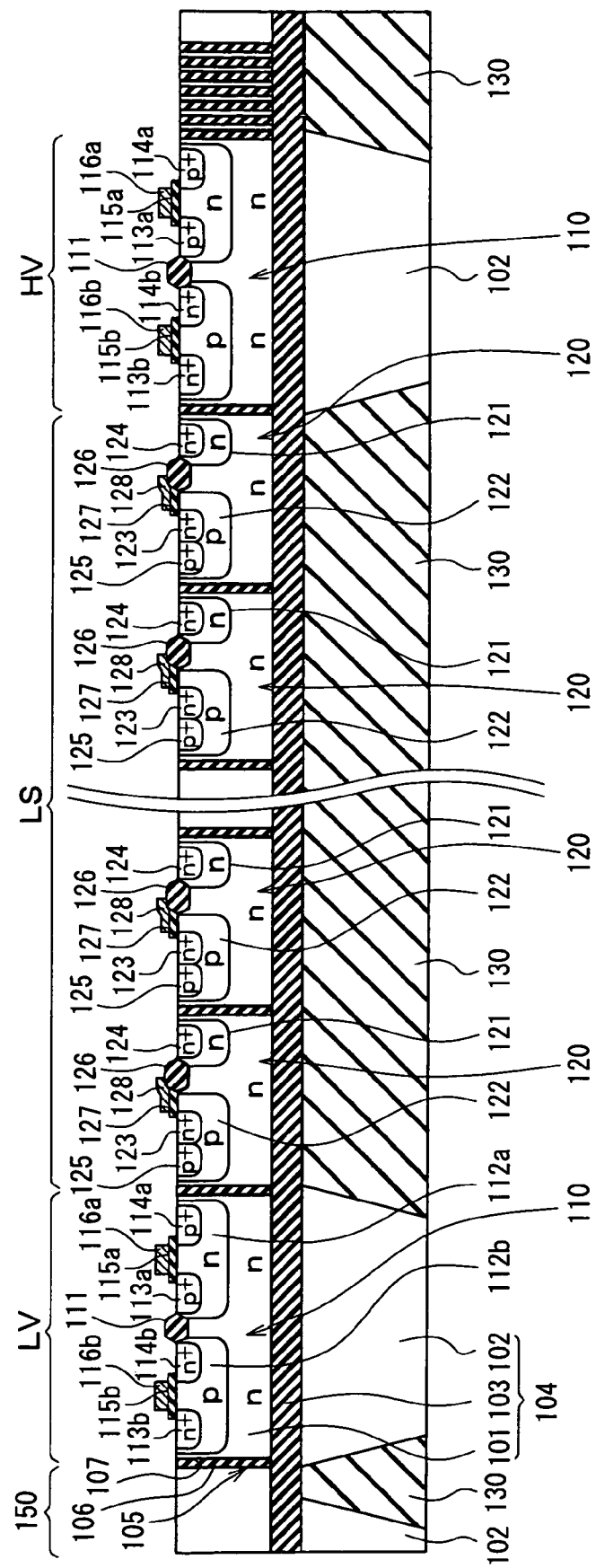
FIG. 9 is a cross sectional diagram taken along line IX-IX in FIG. 10 and illustrating a semiconductor apparatus in accordance with a third embodiment.
Figure 10:
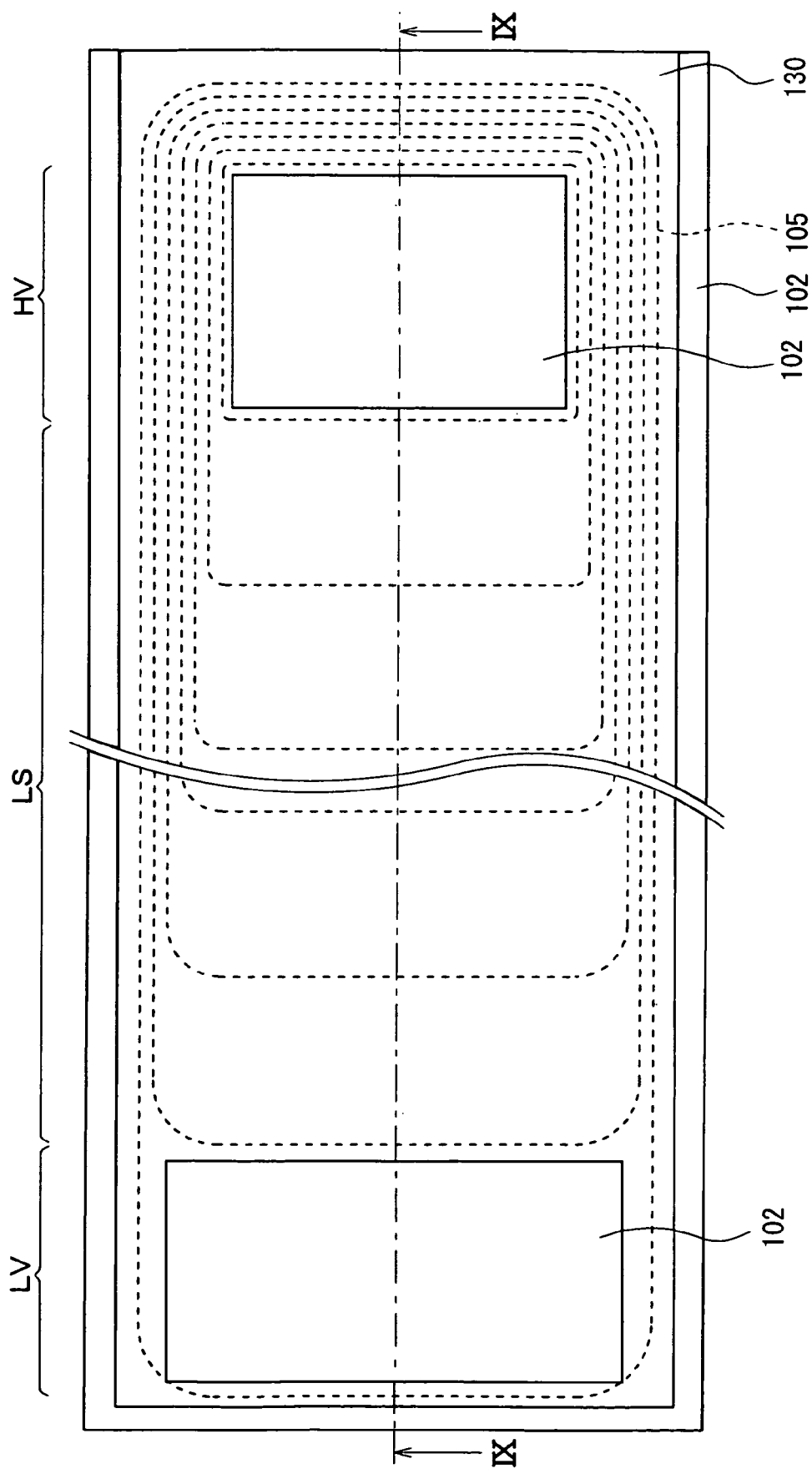
FIG. 10 is a diagram illustrating a layout of elements on a rear surface side of the semiconductor apparatus illustrated in FIG. 9.

FIG. 9 is a cross sectional diagram taken along line IX-IX in FIG. 10 and illustrating a semiconductor apparatus in accordance with the present embodiment. FIG. 10 is a diagram illustrating a layout of elements on a rear surface side of the semiconductor apparatus illustrated in FIG. 9.

As shown in FIGS. 9 and 10, an element-outside part 150 is located outward of the outermost trench insulation member 105. A third portion of the support substrate 102 is located at a place that corresponds to the element-outside part 150. The third portion of the support substrate 102 is opposite to the element-outside part 150 with respect to the buried oxide film 103. More specifically, the third portion of the support substrate 102 has a generally U shape. The third portion has two side parts, which extend along a direction in which the high and low potential reference circuit part HV and LV are arranged. The part of the element-outside part 150 further has another side part, which faces the low potential reference circuit part LV.

When the support substrate 102 has the above-described part in a place that corresponds to the element-outside part 150, it is possible to enhance an exterior frame strength.

Fourth Embodiment

A difference between a semiconductor apparatus of the present embodiment and that of second embodiment includes such a configuration that the support substrate 102 has a third portion in a place corresponding to an element-outside part in a similar manner as that of a third embodiment.

Figure 11:
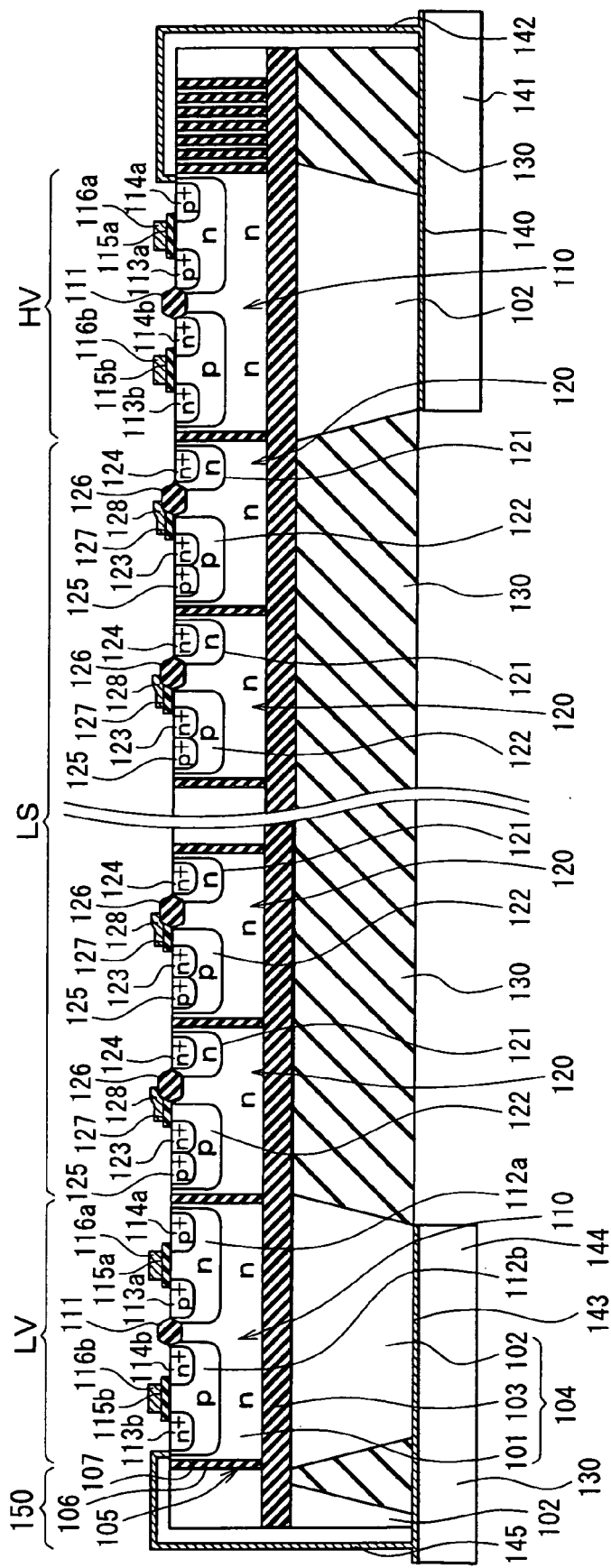
FIG. 11 is a cross sectional diagram illustrating a semiconductor apparatus in accordance with a fourth embodiment.

FIG. 11 is a cross sectional diagram illustrating a semiconductor apparatus in accordance with the present embodiment. As shown in FIG. 11, the third portion of the support substrate is located in a place corresponding to the element-outside part 150. According to the above configuration, the semiconductor apparatus of the present embodiment can have advantages as that of the second embodiment has. Further, it is possible to enhance the strength of an exterior frame of the semiconductor apparatus.

According to the present embodiment, through the conductive pattern 143, the third portion of the support substrate 102 is electrically connected with a terminal for obtaining the reference potential of the low potential reference circuit part LV. Alternatively, the third portion of the support substrate 102 may be in a floating state and may not have an electrical potential substantially equal to the reference potential of the low potential reference circuit part LV.

Fifth Embodiment

A difference between a semiconductor apparatus of the present embodiment and that of a third embodiment includes arrangement of the support substrate 102.

Figure 12:
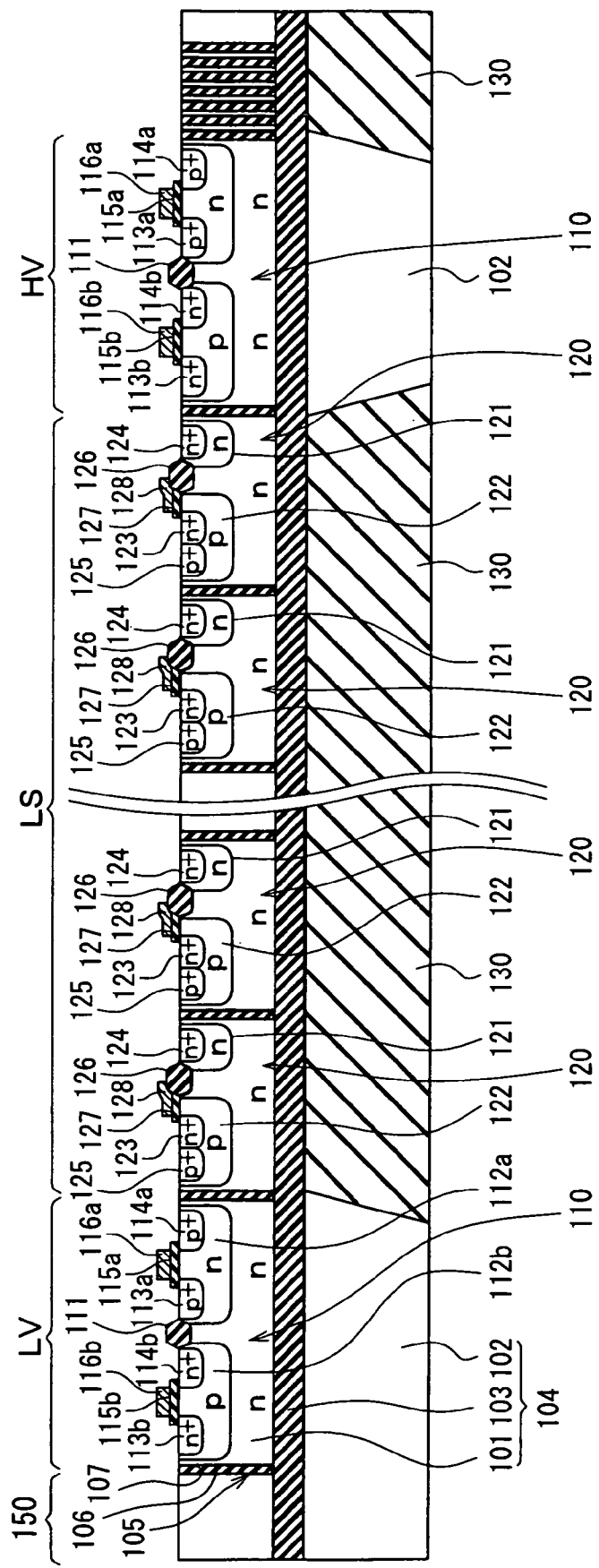
FIG. 12 is a cross sectional diagram taken along line XII-XII in FIG. 13 and illustrating a semiconductor apparatus in accordance with a fifth embodiment.
Figure 13:
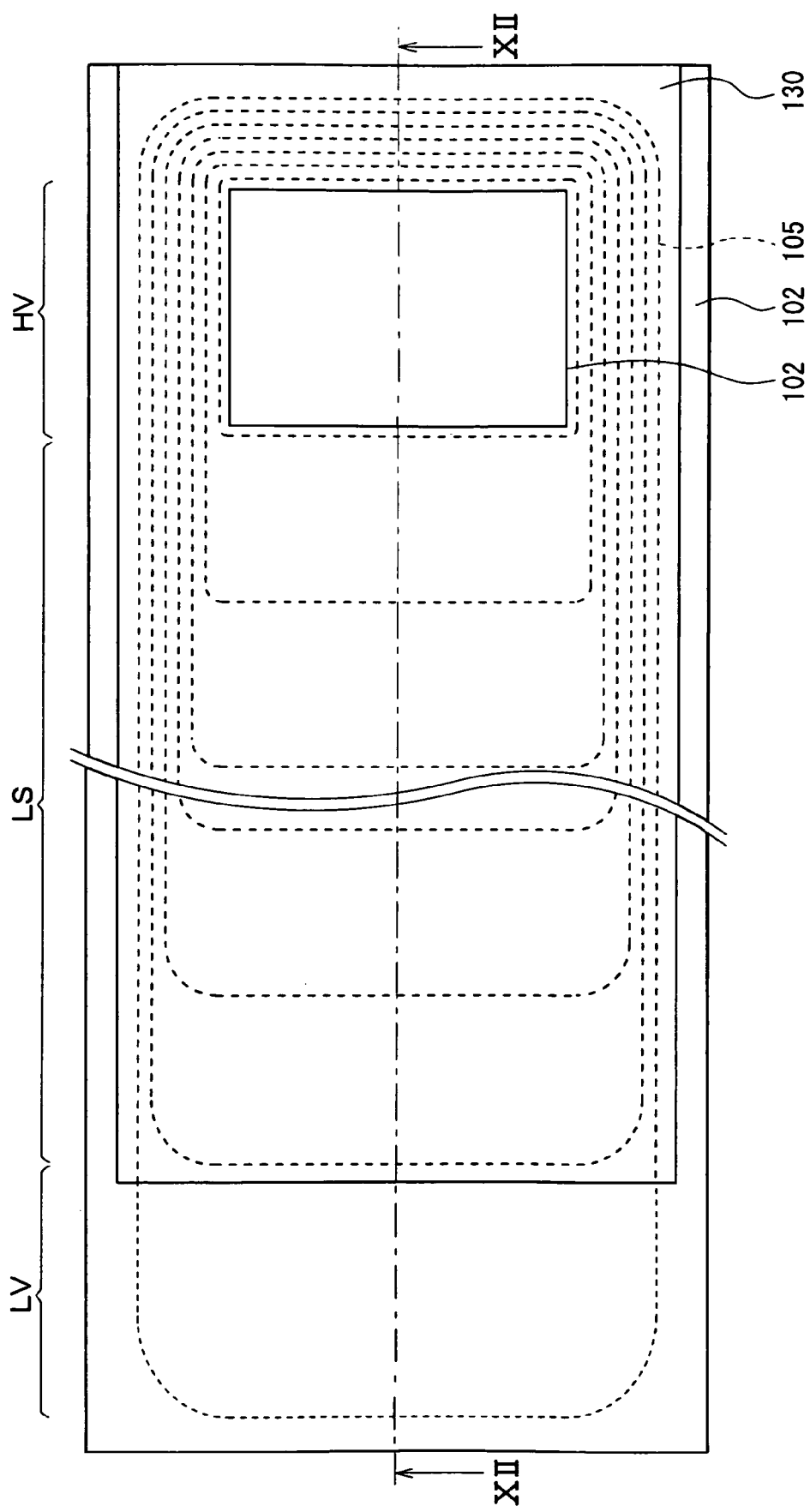
FIG. 13 is a diagram illustrating a layout of elements on a rear surface side of the semiconductor apparatus illustrated in FIG. 12.
Figure 14:
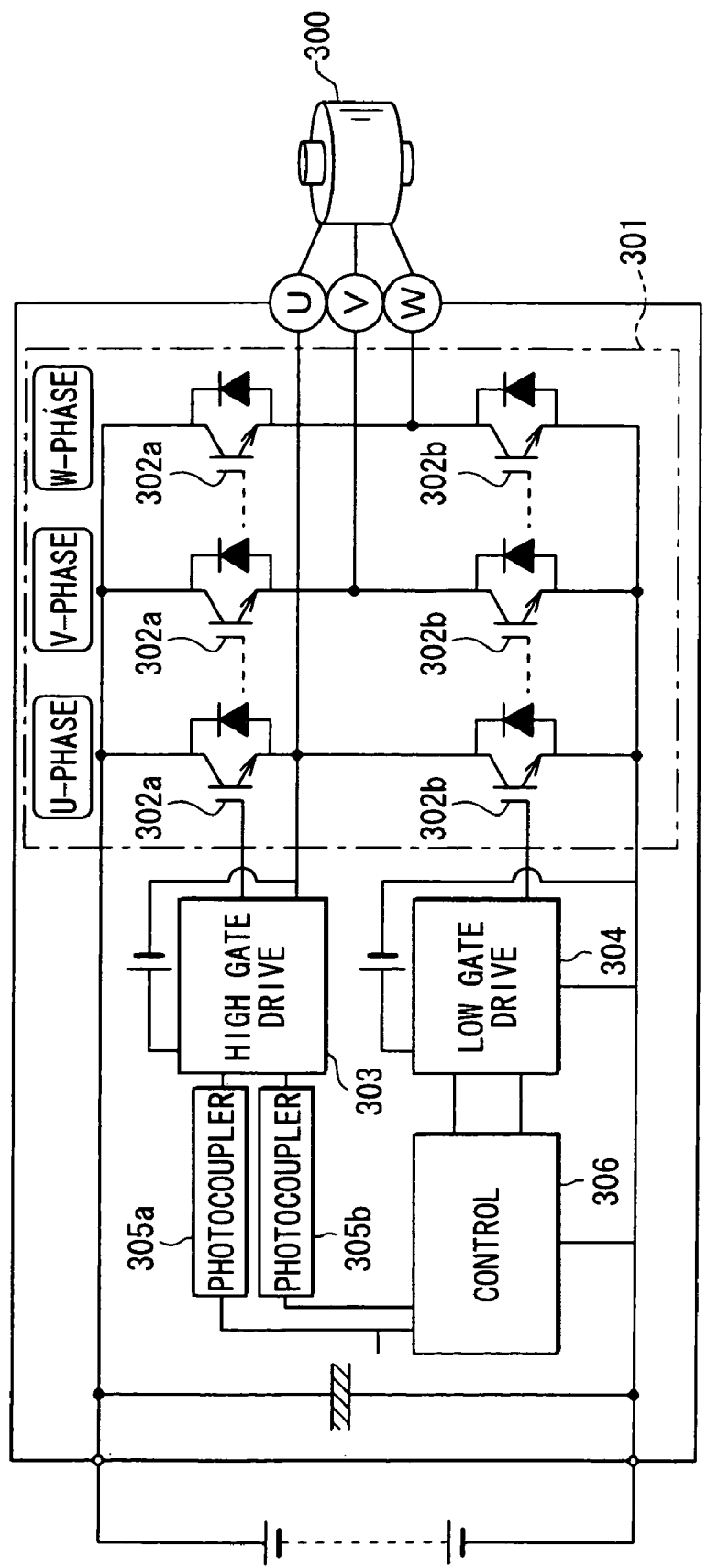
FIG. 14 is a diagram illustrating a circuit configuration for control of an inventor circuit for driving a motor in accordance with the prior part.
Figure 15:
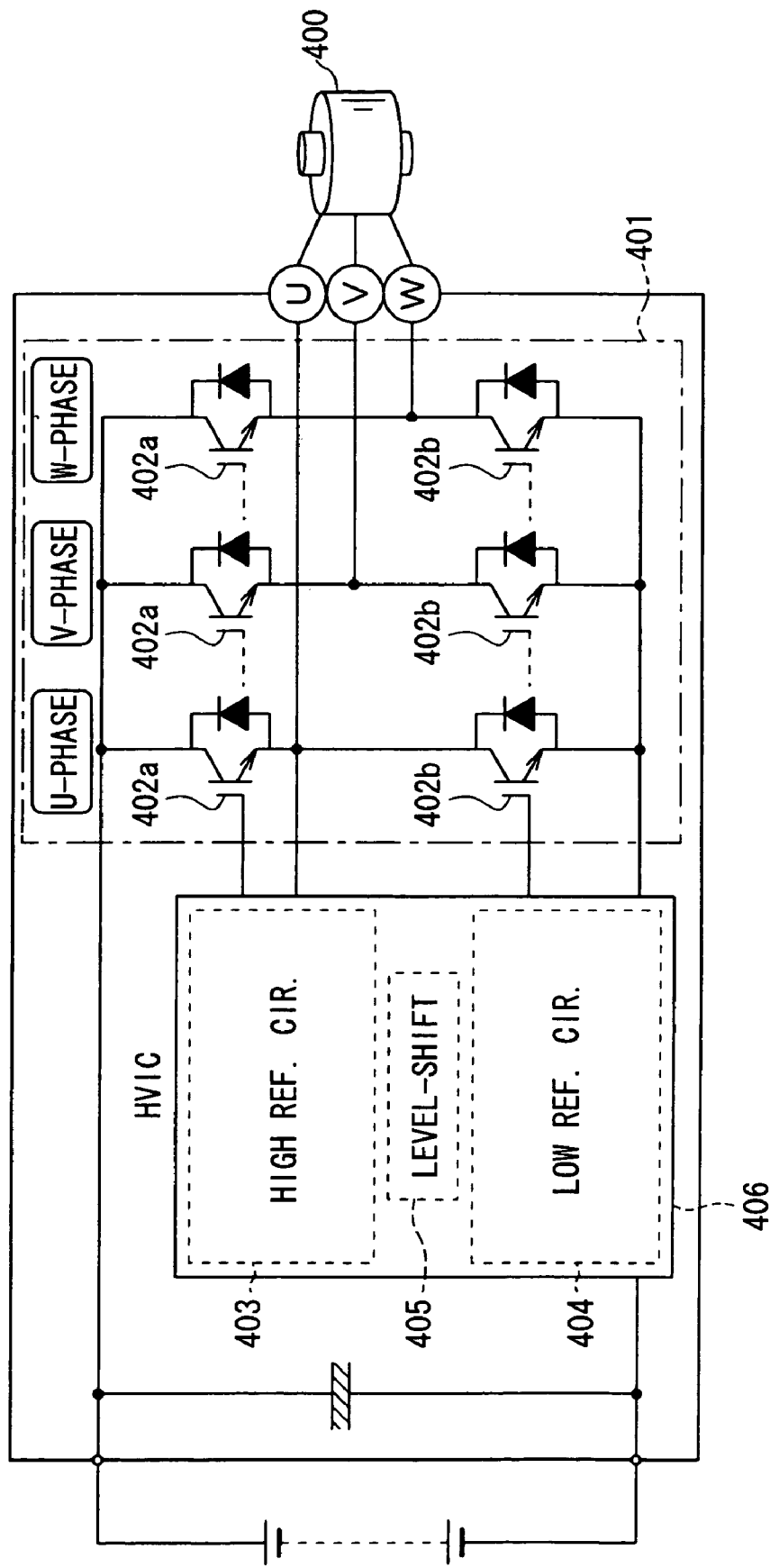
FIG. 15 is a diagram illustrating another circuit configuration for control of an inventor circuit for driving a motor in accordance with the prior art.

FIG. 12 is a cross sectional diagram taken along line XII-XII in FIG. 13 and illustrating a semiconductor apparatus in accordance with the present embodiment. FIG. 13 is a diagram illustrating a layout of elements on a rear surface side of the semiconductor apparatus in FIG. 12.

As shown in FIGS. 12 and 13, the support substrate 102 has a third portion, which is located in a place corresponding to the element-outside part 150. The third portion and the first portion of the support substrate 102 are joined and integrated. The semiconductor apparatus having the above configuration can have similar advantages as that of a second embodiment has. Further, it is possible to enhance strength of an exterior frame of the semiconductor apparatus.

Modifications of First to Fifth Embodiments

First to fifth embodiments give the example element of the low potential reference circuit part LV, the high potential reference circuit part HV and the level-shifting element forming part LS. Alternatively, each portion LV, HV, LS may include another element other than or in addition to the above-described example elements.

In first to fifth embodiments, the insulation member 130 located between the parts of the support substrate 102 is made of resin. Alternatively, the insulation member 130 may be an insulation film such as an oxide film and the like. Alternatively, the insulation member 130 may be air, vacuum or the like. When the insulation member 130 is air or vacuum, although such insulation member 130 does not have a solid body, the air or the vacuum can function as the insulation member 130. When the insulation member 130 is vacuum, sealing is required. For example, a case for accommodating the semiconductor is required to maintain vacuum. In other words, it is required to provide a configuration for utilizing vacuum as the insulation member 130.

In third to fifth embodiments, the third portion of the support substrate 102 has a generally U shape. However, the shape of the third portion of the support substrate 102 is not limited to the above example. For example, the third portion of the support substrate 102 may be located in a place that correspond to whole of the element-outside part 150 and may have a generally ring shape. Alternatively, the third portion may have only two side parts each extending along a direction in which the high and low potential reference circuit part HV and LV are arranged. Alternatively, the third portion may have one side extending along a direction in which the high and low potential reference circuit part HV and LV are arranged, and further have another side part, which faces the high or low potential reference circuit part HV, LV, so that the third portion have a generally L shape.

In a second embodiment and a fourth embodiments, the low potential reference circuit part LV and the first portion of the support substrate 102 have a substantially same potential, and the high potential reference circuit part HV and the second portion of the support substrate 102 have a substantially same potential. Alternatively, only the high potential reference circuit part HV and the second portion of the support substrate 102 may have a substantially same potential. In the above case, the semiconductor apparatus may have the above-described advantages.

Figure 26:
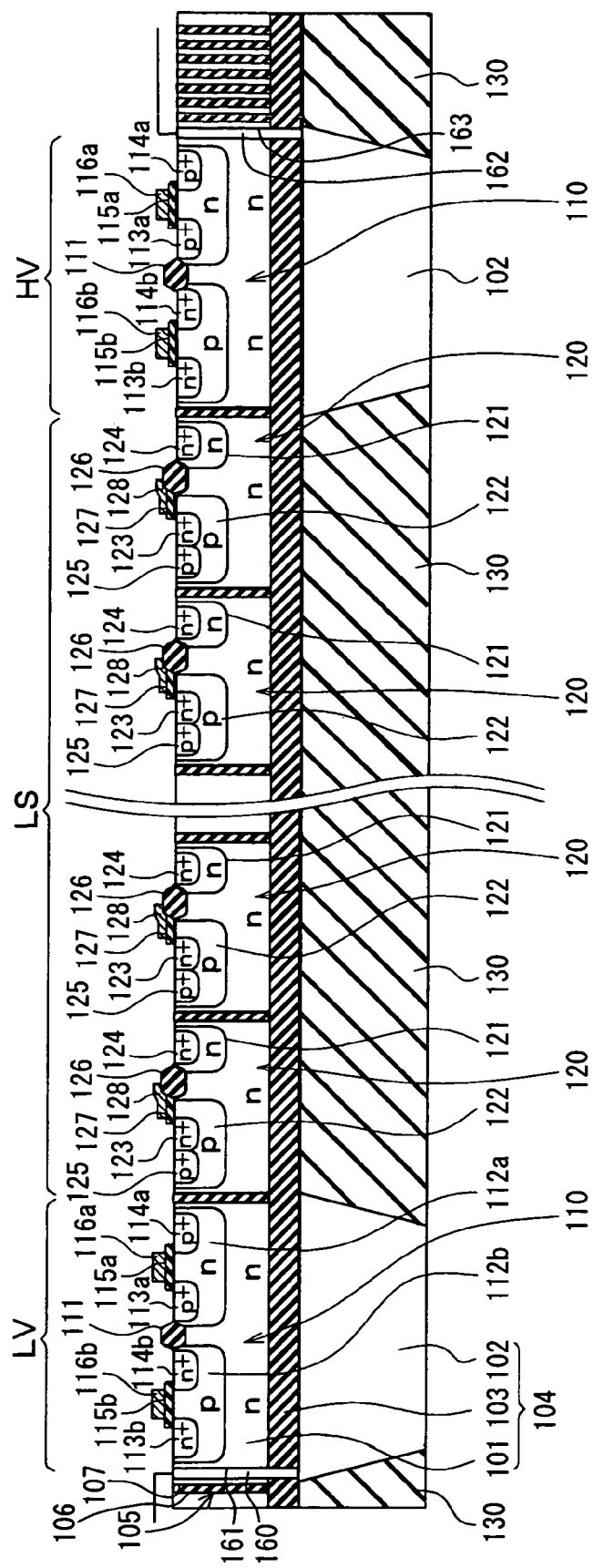
FIG. 26 is a cross sectional diagram illustrating a semiconductor apparatus in accordance with a modification example of the exemplary embodiments.
Figure 27:
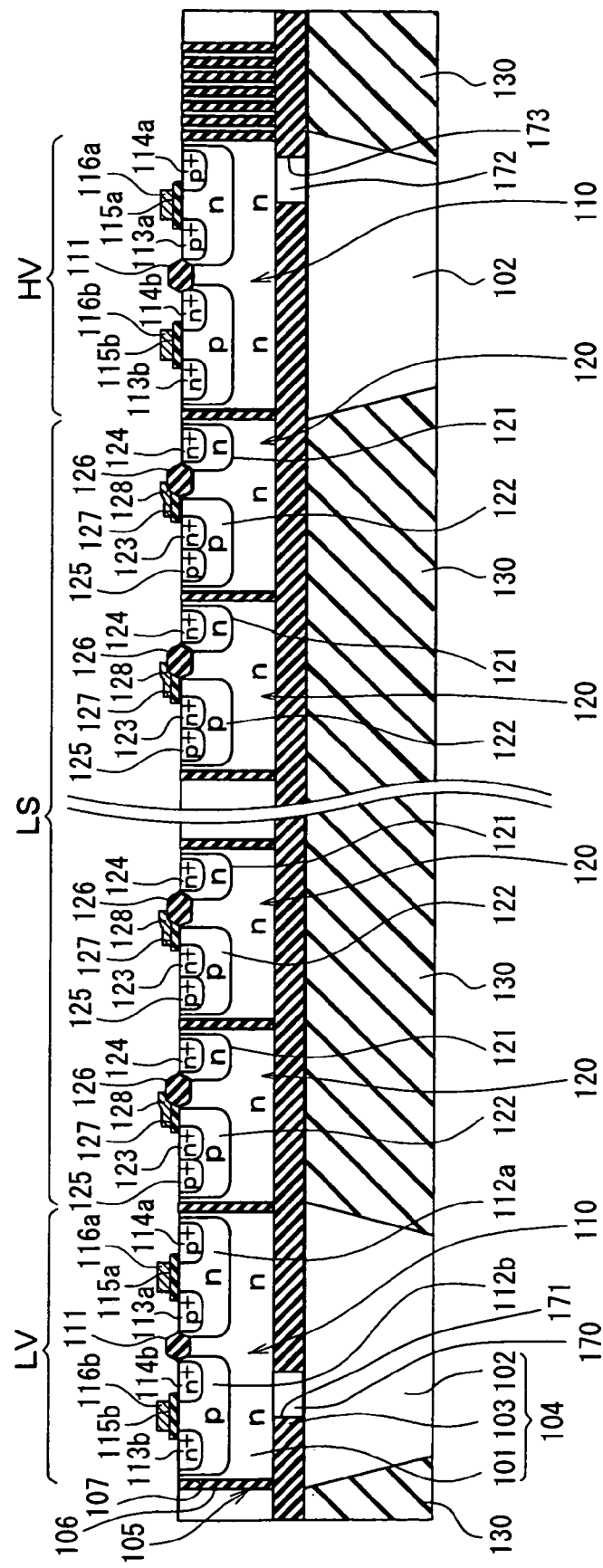
FIG. 27 is a cross sectional diagram illustrating a semiconductor apparatus in accordance with another modification example of the exemplary embodiments.

In a second embodiment and a fourth embodiment, the wire 142 electrically connects the high potential reference circuit part HV and the second portion of the support substrate 102, and the wire 145 electrically connects the low potential reference circuit part LV and the first portion of the support substrate 102. Alternatively, for providing such electrical connections, a structure or an element other than the wire 142, 145 may be employed. For example, as shown in FIG. 26, a penetration electrode 162 may electrically connect the high potential reference circuit part HV and the second portion of the support substrate 102. Also, another penetration electrode 160 may electrically connect the low potential reference circuit part LV and the first portion of the support substrate 102. As shown in FIG. 26, the penetration electrode 160, 162 may be disposed in a trench 161, 163. More specifically, as shown in FIG. 26, the trench 161, 163 and the penetration electrode 160, 162 may penetrate the SOI layer 101 and the buried oxide film 103. Alternatively, as shown in FIG. 27, by utilizing a substrate 104 having a partial SOI structure, the low and high potential reference parts LV, HV may be electrically connected with the support substrate 102. In the partial SOI structure, the buried oxide film 103 has a portion that is not made of an insulating material but made of, for example, silicon. As shown in FIG. 27, a first silicon part 170 of the buried oxide film 103 may be disposed between the low potential reference circuit part LV and the first portion of the support substrate 102, so that the low potential reference circuit part LV is electrically connected with the first portion of the support substrate 102. A second silicon part 172 may be disposed between the high potential reference circuit part HV and the second portion of the support substrate 102, so that the high potential reference circuit part HV is electrically connected with the second portion of the support substrate 102. Accordingly, the first and second silicon parts 170, 172 in the partial SOI structure can function as a penetration electrode.

In a semiconductor apparatus of the above embodiments, by using the wires 142, 145, the penetration electrodes 160, 162, the silicon parts 170, 172 in the partial SOI structure or the like, the low and high potential reference circuit parts LV, HV may be respectively electrically connected with the first and second portions of the support substrate 102. Alternatively, the high potential reference circuit part HV may be electrically connected with the second portion of the support substrate 102 through the wirings 142, the penetration electrodes 162, the silicon part 172 in the partial SOI structure or the like, while the low potential reference circuit part LV may not be electrically connected with the first portion of the support substrate 102. Alternatively, the low potential reference circuit part LV may be electrically connected with the first portion of the support substrate 102 through the wirings 145, the penetration electrodes 160, the silicon part 170 in the partial SOI structure or the like, while the high potential reference circuit part HV may not be electrically connected with the first portion of the support substrate 102.

Sixth Embodiment

Figure 16:
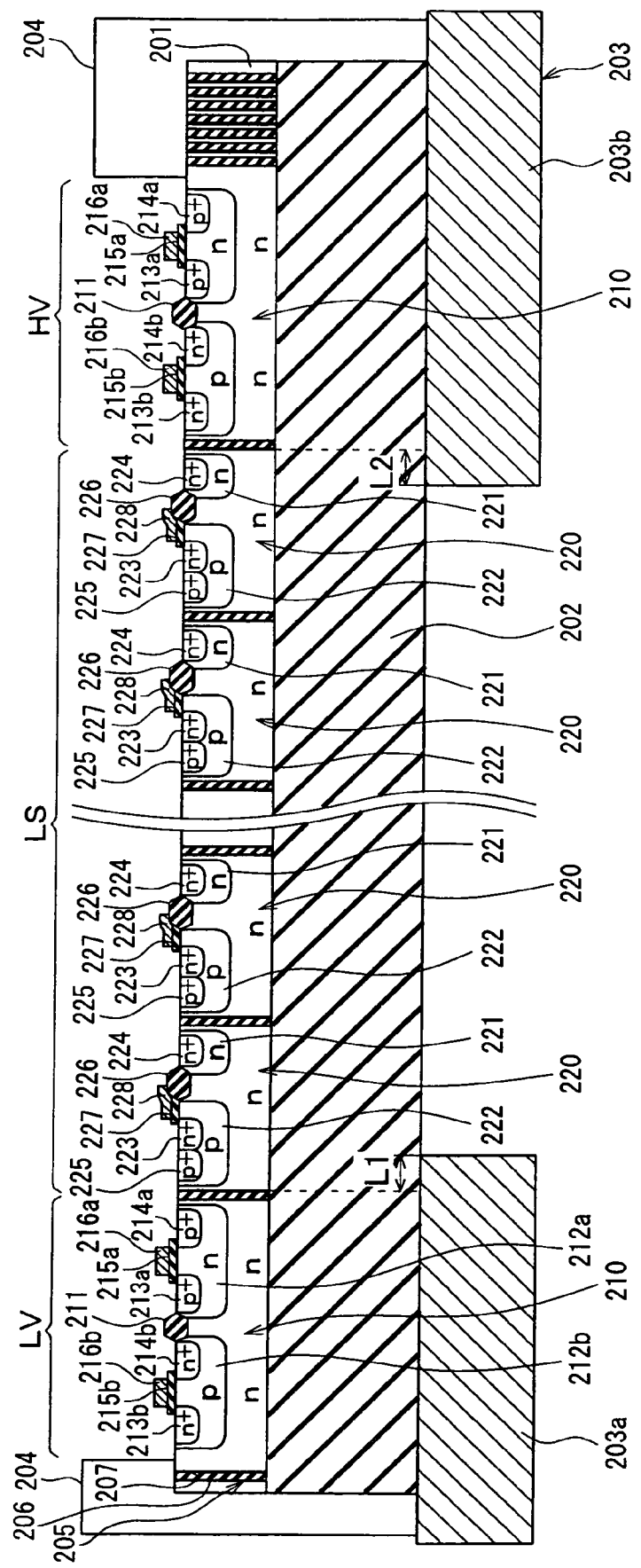
FIG. 16 is a cross sectional diagram taken along line XVI-XVI in FIG. 17 and illustrating a semiconductor apparatus in accordance with a sixth embodiment.
Figure 17:
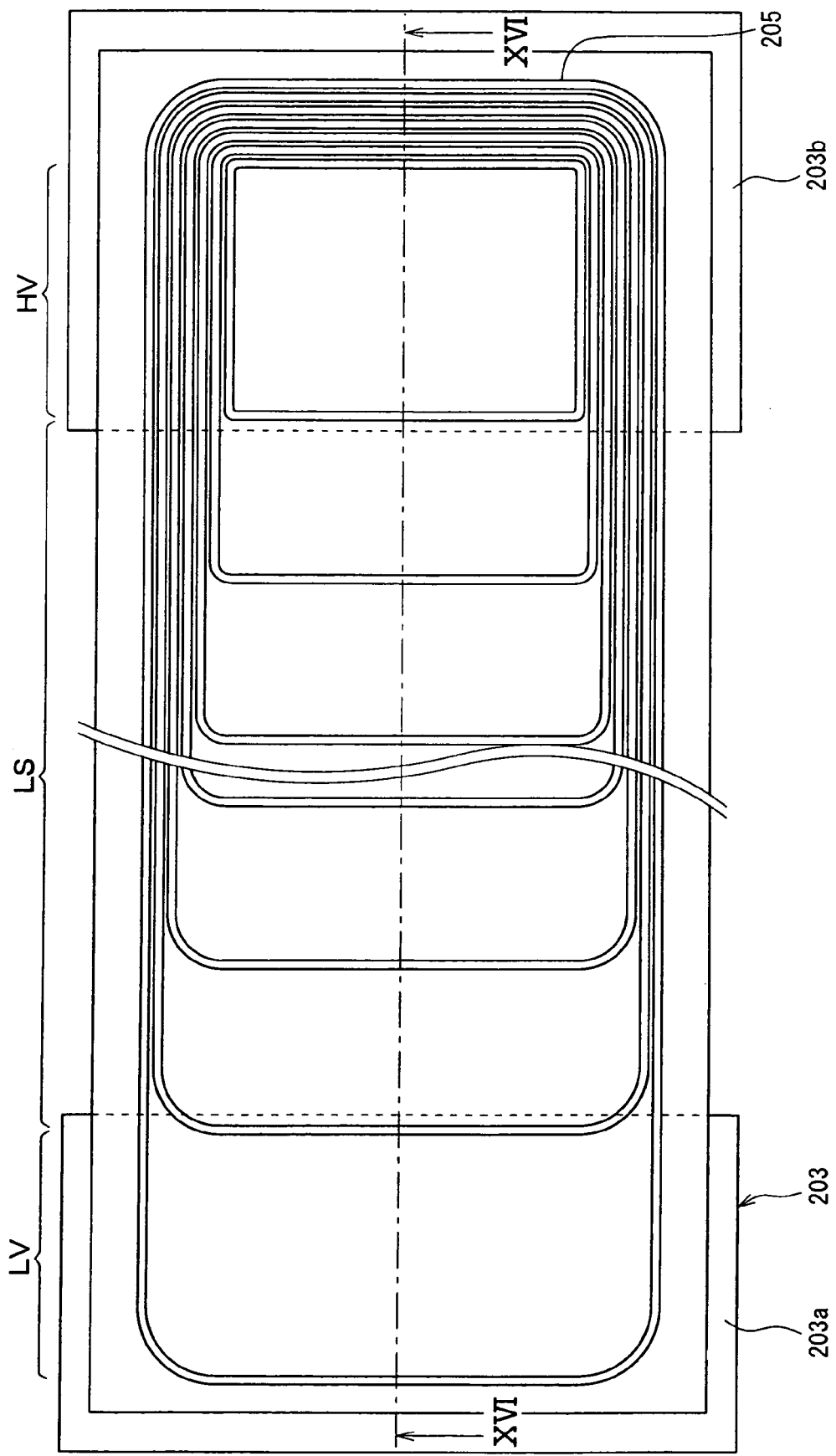
FIG. 17 is a layout diagram illustrating the semiconductor apparatus in FIG. 16 viewed from a front surface side of the semiconductor apparatus.

A configuration of a semiconductor apparatus of a sixth embodiment is described below with reference to FIGS. 16 and 17. FIG. 16 is a cross sectional diagram taken along line XVI-XVI in FIG. 17 and illustrating a semiconductor apparatus (i.e., HVIC) in accordance with a sixth embodiment. FIG. 17 is a layout diagram viewed from a top surface side of the semiconductor apparatus illustrated in FIG. 16. In the following description, an upper side of the FIG. 16 is assumed to be a front surface side of a semiconductor apparatus, and a lower side of the FIG. 16 is assumed to be a rear surface of the semiconductor apparatus.

As shown in FIG. 16, the semiconductor apparatus of the present embodiment includes a semiconductor layer 201, an insulating substrate 202, a lead frame 203, and a bonding wire 204. The semiconductor layer 201 is made of, for example, silicon having an N conductivity type. The semiconductor layer 201 is bonded to the lead frame 203 through the insulating substrate 202. A predetermined portion of the semiconductor layer 201 is electrically connected with the lead frame 203 through the bonding wire 204. The insulating substrate 202 can function as an insulating member 202.

The semiconductor layer 201 is located on the front surface side of the semiconductor apparatus. The semiconductor layer 201 is formed by grinding a silicon substrate to a predetermined thickness. In the semiconductor layer 201, multiple trench isolation members 205 separate elements from each other. Each trench isolation member 205 includes a trench 206 and an insulating film 207 located inside the trench 206. The trench 206 extends from the front surface of the semiconductor layer 201 to the insulating substrate 202. The multiple trench isolation members 205 may have a substantially same width.

The multiple trench isolation members 205 are arranged in a multiple ring pattern. A low potential reference circuit part LV, which corresponds to a region illustrated in a left-hand side of FIG. 16, is in a region between an outermost trench isolation member 205 and a trench isolation member 205 adjacent to the outermost trench isolation member 205. A high potential reference circuit part HV, which corresponds to a region illustrated in a right-hand side of FIG. 16A, is in a region surrounded by an innermost trench isolation member 205. A level-shift element forming part LS is in a region between the high and low potential reference circuit parts HV and LV.

The low potential reference circuit part LV of the semiconductor layer 201 includes a signal processing circuit, which is a logic circuit for instance and is driven by a low potential. The signal processing circuit operates at a reference potential (i.e., a first potential) of 0V. The low potential reference circuit part LV is separated from other parts of the semiconductor apparatus by the trench isolation members 205. The low potential reference circuit part LV includes various elements (e.g., a CMOS 210) as elements of the signal processing circuit. More specifically, an insulating layer 211 for element separation separates elements from each other in the semiconductor layer 201. The insulating layer 211 may be a shallow trench isolation (STI), a local oxidation of silicon (LOCOS) layer, or the like. Each separated region is, for example, an N well layer 212a or a P well layer 212b. A P+ type source region 213a and a P+ type drain region 214a are located in the N well layer 212a. An N+ type source region 213b and an N+ type drain region 214b are located in the P type well layer 212b. Through a gate insulating film 215a, a gate electrode 216a is located above a surface of the N well layer 212a, which surface is positioned between the P+ type source region 213a and the P+ type drain region 214a. Through a gate insulating film 215b, a gate electrode 216b is located above a surface of the P well layer 212b, which surface is positioned between the N+ type source region 213b and the N+ type drain region 214b. Thus, there is provided a CMOS 210 having a combination of an N channel MOSFET and a P channel MOSFET.

The low potential reference circuit part LV of the semiconductor layer 201 includes line elements (not shown) and an interlayer insulation film (not shown) on a front surface side of the semiconductor layer 201. The line elements are electrically connected with elements of the CMOS 210, including each gate electrode 216a, 216b, each source region 213a, 213b, and each drain region 214a, 214b. The low potential reference circuit part LV may further include a bipolar transistor, a diffusion resistor, a memory, or the like (not shown).

The high potential reference circuit part HV of the semiconductor layer 201 includes a signal processing circuit, which is a logic circuit for instance and is driven by a high potential. The signal processing circuit operates at a reference potential of, for example, 1200 V, which is larger than that of the low potential reference circuit part LV. The reference potential of the high potential reference circuit part HV is also referred to as a second potential. The high potential reference circuit part HV is separated from other parts of the semiconductor apparatus by the trench isolation members 205. The high potential reference circuit part HV includes a CMOS 210, a configuration of which is substantially identical to that in the low potential reference circuit part LV. The high potential reference circuit part HV may further include a bipolar transistor, a diffusion resistor, a memory, or the like (not shown).

The level-shift element forming part LS includes an LDMOS as a level-shift element 220 (LDMOS: a lateral diffused metal oxide semiconductor) having a high breakdown voltage. In a surface portion of the semiconductor layer 201, the LDMOS 220 includes an N type drain region 221, a P type channel region 222, and an N+ type source region 223. An N+ type contact layer 224 is formed in a surface portion of the N type drain region 221. A P+ type contact layer 225 is formed in a surface portion of the P type channel region 222. The N type drain region 221 and the P type channel region 222 are separated from each other by a LOCOS oxidation film 226. A gate electrode 228 is located above the P type channel region 222 through a gate insulating film 227. The LDMOS 220 having a high breakdown voltage is provided with the above configuration.

A line element (not shown) and an interlayer insulation film (not shown) are formed on the front surface side of the semiconductor layer 201. The line element is electrically connected with the gate electrode 228, the N+ type source region 223 and the P+ type contact layer 225, or the N+ type contact layer 224.

Multiple cells each having the LDMOS 220 having the above configuration and high breakdown voltage are formed between the low and high potential parts LV, HV. The multiple cells are separated from each other by the trench isolation members 205.

The insulating substrate 202 is made of insulating material such as glass, resin, or the like. The insulating substrate 202 functions as an insulating member. A thickness of the insulating substrate 202 may be arbitrary. However, as described below, since a potential is biased when the semiconductor apparatus is in operation, it is preferable that the insulating substrate 202 is formed as thin as possible while the insulating substrate 202 is having enough thickness to ensure insulation between the semiconductor layer 201 and the lead frame 203. The bias of potential varies depending on material of the insulating substrate 202, more specifically, depending on permittivity of the insulating substrate 202. A preferable thickness of the insulating substrate 202 may be determined in accordance with material of the insulating substrate 202.

The lead frame 203 may function as a conductive member. In the present embodiment, the lead frame 203 is used for applying the reference voltage of the low potential reference circuit part LV and for applying the reference voltage of the high electrical potential reference circuit part HV.

As shown in FIGS. 16 and 17, the lead frame 203 is located below the low and high potential circuit parts LV, HV so as to be opposite to the low and high potential circuit parts LV, HV, respectively. As shown in FIG. 16, the lead frame 203 has a first lead frame 203a as a first conductive member 203a, which corresponds to the low potential reference circuit part LV. The lead frame 203 further has a second lead frame 203b as a second conductive member, which corresponds to the high potential reference circuit part HV. The first lead frame 203a extends a distance L1 toward inside of the level-shift element forming part LS from the trench isolation member 205 that separates the low potential reference circuit part LV and the level-shift element forming part LS from each other. The second lead frame 203b extends a distance L2 toward inside of the level-shift element forming part LS from the trench isolation member 205 that separates the high potential reference circuit part HV and the level-shift element forming part LS from each other.

The distances L1 and L2 are designed taking into account the positioning displacement that may take place in manufacturing the semiconductor apparatus. The distance L1 is basically designed to be equal to the distance L2. More specifically, in the manufacturing, after each element is formed in the semiconductor layer 201, the insulating substrate 202 and the lead frame 203 may be positioned and attached. In the above process, the positioning displacement may take place. On the basis of estimation of a possible maximum positioning displacement, each distance L1, L2 is set to the possible maximum value. When the positioning displacement takes place in manufacturing the semiconductor apparatus, the first and second lead frames 203a, 203b may be displaced in a same direction. In the above case, although the distance L1 may not become equal to the distance L2, since the distances L1 and L2 are designed taking into account the possible maximum positional displacement, an end of the first lead frame 203a on a high potential reference circuit part HV side cannot be positioned outside of the trench isolation member 205 that separates the low potential reference circuit part LV and the level-shifting forming part LS. Further, an end of the second lead frame 203b on a low potential reference circuit part LV side cannot be positioned outside of the trench isolation member 205 that separates the high potential reference circuit part HV and the level-shifting forming part LS from each other.

The first lead frame 203a is electrically connected with a line (not shown) to which a reference potential for the low potential reference circuit part LV is applied through the bonding wire 204. The second lead frame 203b is electrically connected with a line (not shown) to which a reference potential for the high potential reference circuit part HV is applied through the bonding wire 204.

In the above semiconductor apparatus, the first lead frame 203a is arranged in correspondence with the low potential reference circuit part LV and the second lead frame 203b is arranged in correspondence with the high potential reference circuit part HV. Thus, a portion of the insulating substrate 202 below the low potential reference circuit part LV is sandwiched between two elements having a same potential, the two elements being the low potential reference circuit part LV and the first lead frame 203a. Another portion of the insulating substrate 202 below the high potential reference circuit part HV is sandwiched between two elements having a same potential, the two elements being the high potential reference circuit part HV and the second lead frame 203b.

It is hence possible to substantially eliminate a potential difference between two ends of a parasitic capacitor in the semiconductor apparatus. It is possible to cancel the parasitic capacitance. It is therefore possible to restrict generation of the displacement current that is caused by the dv/dt surge, and that charges and discharges the parasitic capacitance. It is possible to restrict circuit malfunction.

Figure 18:
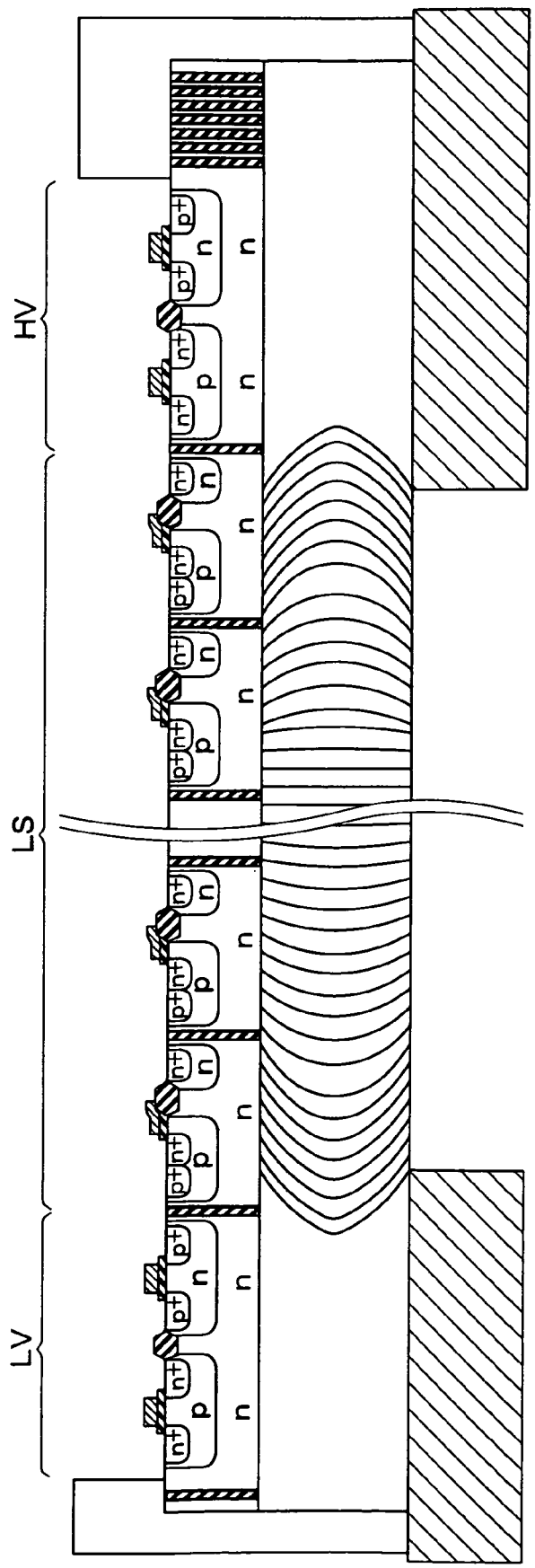
FIG. 18 is a cross sectional diagram illustrating a potential distribution in an insulating substrate of the semiconductor apparatus illustrated in FIG. 16.

When the semiconductor apparatus has the above configuration, a potential difference arises between the high and low potential reference circuit parts HV, LV, thereby to generate an electric field in a portion of the insulating substrate 202 between the high and low potential reference circuit parts HV, LV. FIG. 18 is a schematic diagram illustrating an equi-potential line distribution in the insulating substrate 202 of the semiconductor apparatus. As shown in FIG. 18, all of the equi-potential lines in the insulating substrate 202 are not parallely arranged between the high and low potential reference circuits HV, LV. The potentials are more biased as closer to the high potential reference circuit HV or the low potential reference circuit LV in the insulating substrate 202. The above potential bias may form a parasitic capacitance between the high potential reference circuit part HV and the portion having the biased potential, and also between the low potential reference circuit part LV and another portion having the biased potential, which may generate a displacement current.

The bias of the potential depends on the thickness and permittivity of the insulating substrate 202. More specifically, the bias of the potential becomes larger as the insulating substrate 202 has a larger thickness or a larger permittivity. Since a material of the insulating substrate 202 uniquely determines the permittivity of the insulating substrate 202, material selection of the insulating substrate determines the permittivity of the insulating substrate 202. The thickness of the insulating substrate 202 is, however, a parameter that can properly be changed according to design. Therefore the insulating substrate 202 having a small thickness can be favorable in terms of efficient suppression of the displacement current.

Seventh Embodiment

A difference between a semiconductor apparatus of the present embodiment and that of a sixth embodiment includes a configuration for providing electric connection between the low potential reference circuit part LV and the first lead frame 203a, and electric connection between the high potential reference circuit part HV and the second lead frame 203b.

Figure 19:
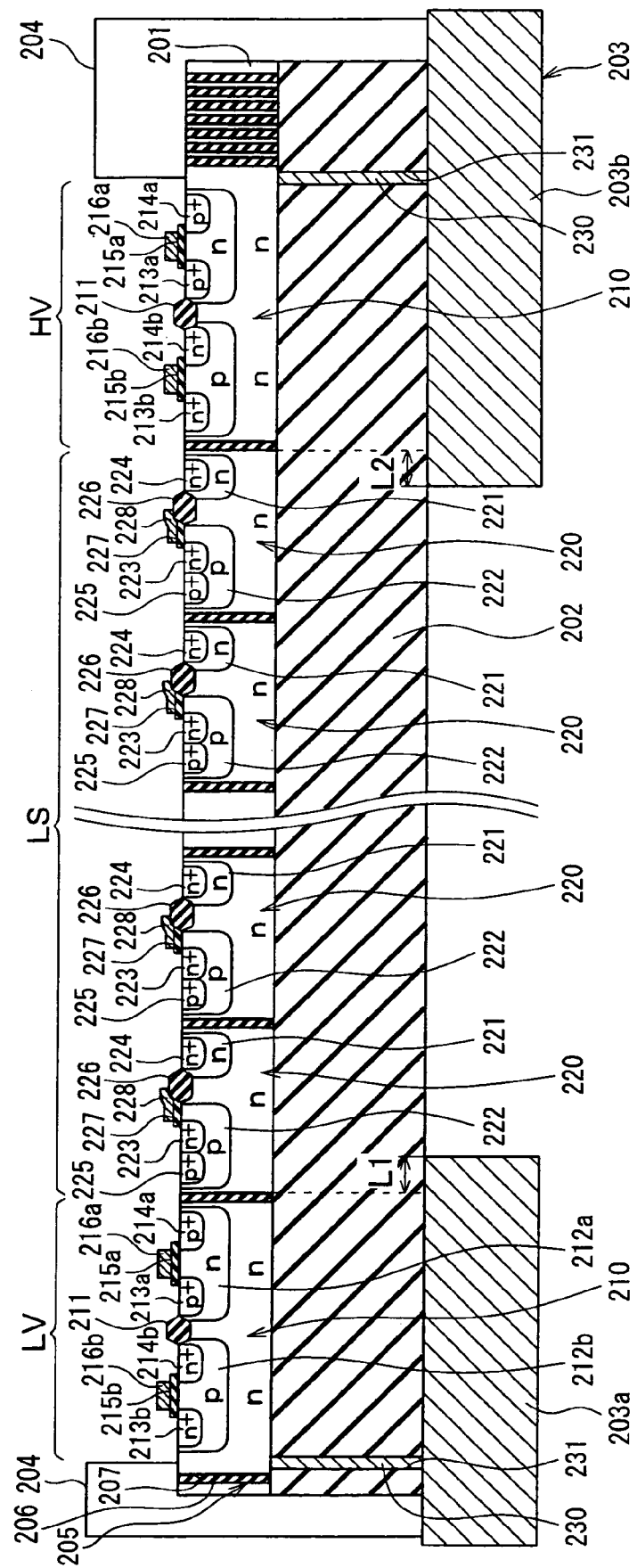
FIG. 19 is a cross sectional diagram illustrating a semiconductor apparatus in accordance with a seventh embodiment.

FIG. 19 is a cross sectional diagram illustrating the semiconductor apparatus (i.e., HVIC) in accordance with the present embodiment. As shown in FIG. 19, penetration electrodes 230 are located in the insulating substrate 202 and located below the high and low potential reference circuit parts HV, LV, respectively. More specifically, a trench 231 is formed in the insulating substrate 202 so as to extend from the semiconductor layer 201 to the lead frame 203. The trench 231 is filled with the penetration electrode 230 made of a conductive material (e.g., aluminum).

Through the penetration electrode 230, the first lead frame 203a is electrically connected with a portion of the low potential reference circuit part LV, the portion to which the reference potential is applied. Further through another penetration electrode 230, the second lead frame 203b is electrically connected with a portion of the high potential reference circuit part HV, the portion to which the reference potential is applied. Merits of the semiconductor apparatus having the above configuration are substantially identical to those of the semiconductor apparatus of a sixth embodiment.

Eighth Embodiment

A semiconductor apparatus of the present embodiment uses a substrate having a conductive pattern in place of the lead frame 203 of the semiconductor apparatus of a sixth embodiment.

Figure 20:
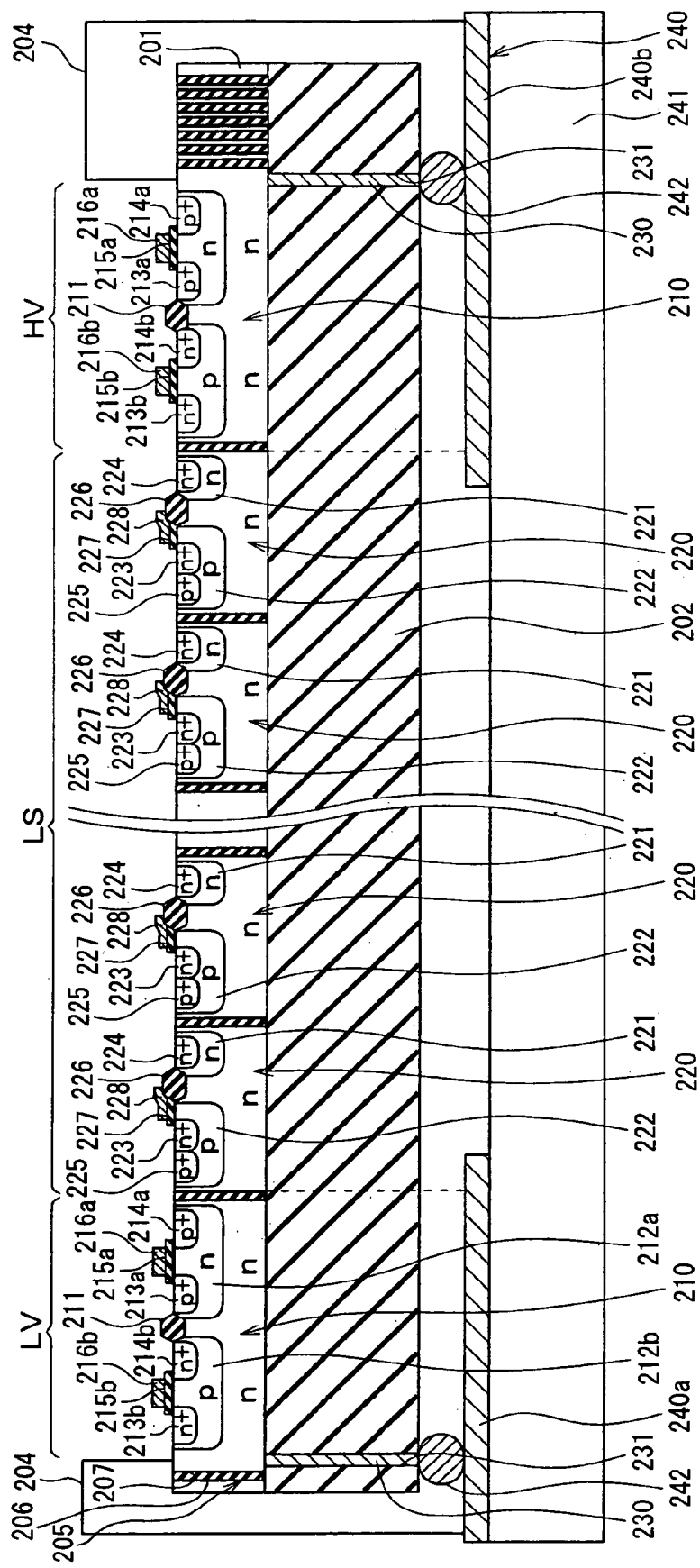
FIG. 20 is a cross sectional diagram illustrating a semiconductor apparatus in accordance with an eighth embodiment.

FIG. 20 is a cross sectional diagram illustrating the semiconductor apparatus (i.e., HVIC) in accordance with the present embodiment. As shown in FIG. 20, the substrate 241 having the conductive pattern 240 is used in place of the lead frame 203 and located on a rear surface side of the insulating substrate 202. The conductive pattern 240 may function as a conductive member. The conductive pattern 240 is used for application of the reference potential of the low potential reference part LV and application of the reference potential of the high potential reference part HV.

As shown in FIG. 20, the conductive pattern 240 includes a first conductive pattern 240a as a first conductive member and a second conductive pattern 240b as a second conductive member. The first conductive pattern 240a is located below a portion of the insulating substrate 202 that corresponds to the low potential reference circuit part LV. A second conductive pattern 240b is located below another portion of the insulating substrate 202 that corresponds to the high potential reference circuit part HV. The first conductive pattern 240a corresponding to the low potential reference circuit part LV is designed to extend a distance L1 toward inside of the level-shift element forming part LS from the trench isolation member 205 that separates the low potential reference circuit part LV and the level-shift element forming part LS. The second conductive pattern 240b corresponding to the high potential reference circuit part HV is designed to extend a distance L2 toward inside of the level-shift element forming part LS from the trench isolation member 205 that separates the high potential reference circuit part HV and the level-shift element forming part LS.

Reasons and merits for providing the distances L1, L2 in the present embodiment are substantially identical to those in a sixth embodiment. Even if the positioning displacement takes place in connecting the conductive pattern 240 and the substrate 241, an end of the first conductive pattern 240a on a level-shift element forming part LS side is prevented from being located outside of the trench isolation member 205 that separates the low potential reference circuit part LV and the level-shift element forming part LS. Further, an end of the second conductive pattern 240b on a level-shift element forming part LS side is prevented from being located outside of the trench isolation member 205 that separates the high potential reference circuit part HV and the level-shift element forming part LS.

A solder bump 242 is located on a rear surface of the insulating substrate 202 so as to be connected to the penetration electrode 230. Through the solder bump 242, the first conductive pattern 240a is electrically coupled with a portion of the low potential reference circuit part LV, the portion to which the reference potential is applied. Through another solder bump 242, the second conductive pattern 240b is also electrically connected with a portion of the high potential reference circuit part HV, the portion to which the reference potential is applied.

Merits of using the conductive pattern 240 in place of the lead frame 203 in the present embodiment are substantially identical to those in a sixth embodiment.

In the above description, explanation is given on a case where a configuration of the present embodiment is applied to the semiconductor apparatus of a seventh embodiment in which the penetration electrode 230 provide the electrical connection. Alternatively, the configuration according to the present embodiment may be applied to the semiconductor apparatus according to a sixth embodiment in which the bonding wire 204 provides the electric connection. More specifically, through the bonding wire 204, the first conductive pattern 240a may be electrically connected with a line to which the reference voltage in the low potential reference circuit part LV is applied. Also, through the bonding wire 204, the second conductive pattern 240b may be electrically connected with a line to which the reference potential in the high potential reference circuit part HV is applied to.

Ninth Embodiment

A semiconductor apparatus of the present embodiment uses an insulating film as an insulating member in place of the insulating substrate 202 of the semiconductor apparatus of a sixth embodiment.

Figure 21:
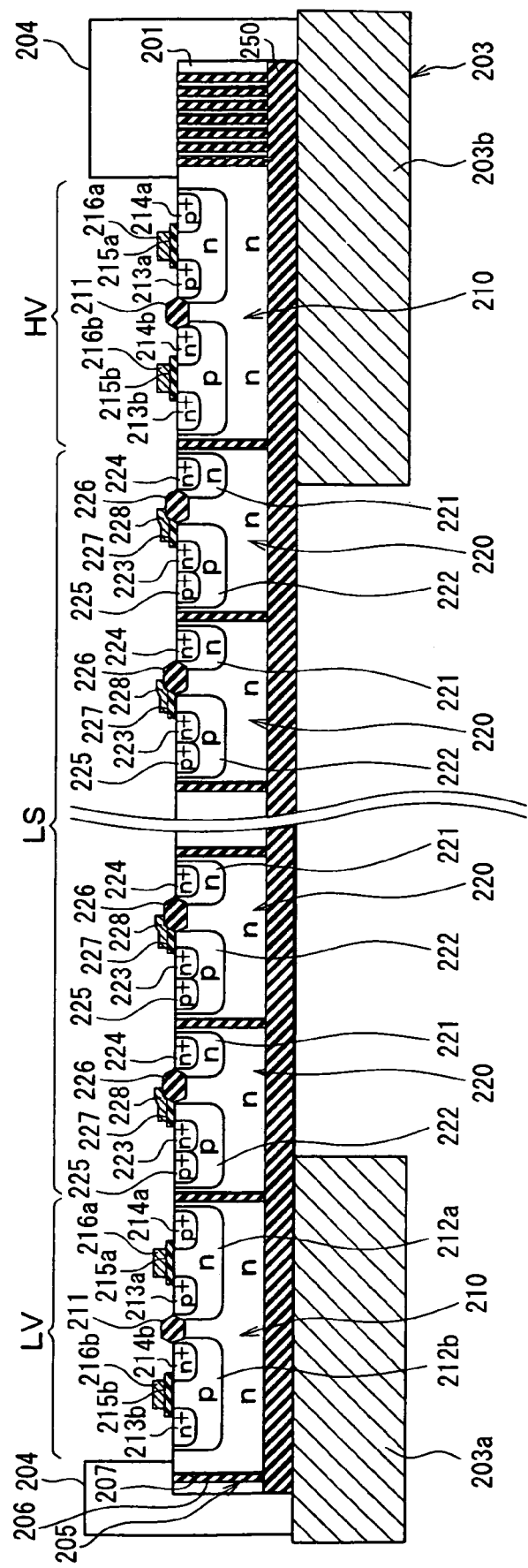
FIG. 21 is a cross sectional diagram illustrating a semiconductor apparatus in accordance with a ninth embodiment.

FIG. 21 is a cross sectional diagram illustrating the semiconductor apparatus (i.e., HVIC) in accordance with the present embodiment. As shown in FIG. 21, the semiconductor apparatus uses an insulating film 250 in place of the insulating substrate 202. The insulating film 250 can functions as an insulating member. The insulating film 250 is provided by, for example, a buried oxide layer in an SOI substrate, which further has an SOI layer providing the semiconductor layer 201 and a support substrate. The SOI layer is bonded to the support substrate through the buried oxide layer. The support substrate is grinded and removed prior to attachment of the lead frame 203. Through the above manners, the semiconductor apparatus of the present embodiment can have the above configuration.

The semiconductor apparatus that uses the insulating film 250 in place of the insulating substrate 202 has advantages as substantially identical as the semiconductor apparatus of a sixth embodiment has. As described above, as the thickness of the insulating substrate 202 is smaller, the displacement current caused by the bias of the potential can be more efficiently suppressed. Thus, the use of the insulating film 250 more efficiently suppresses the displacement current. It is possible to restrict circuit malfunction more efficiently.

Tenth Embodiment

A semiconductor apparatus of the present embodiment includes a substrate 241 having a conductive pattern 240 as similar as the semiconductor apparatus of an eighth embodiment has. In the present embodiment, an encapsulation resin member as an insulating member is used in place of the insulating substrate 202.

Figure 22:
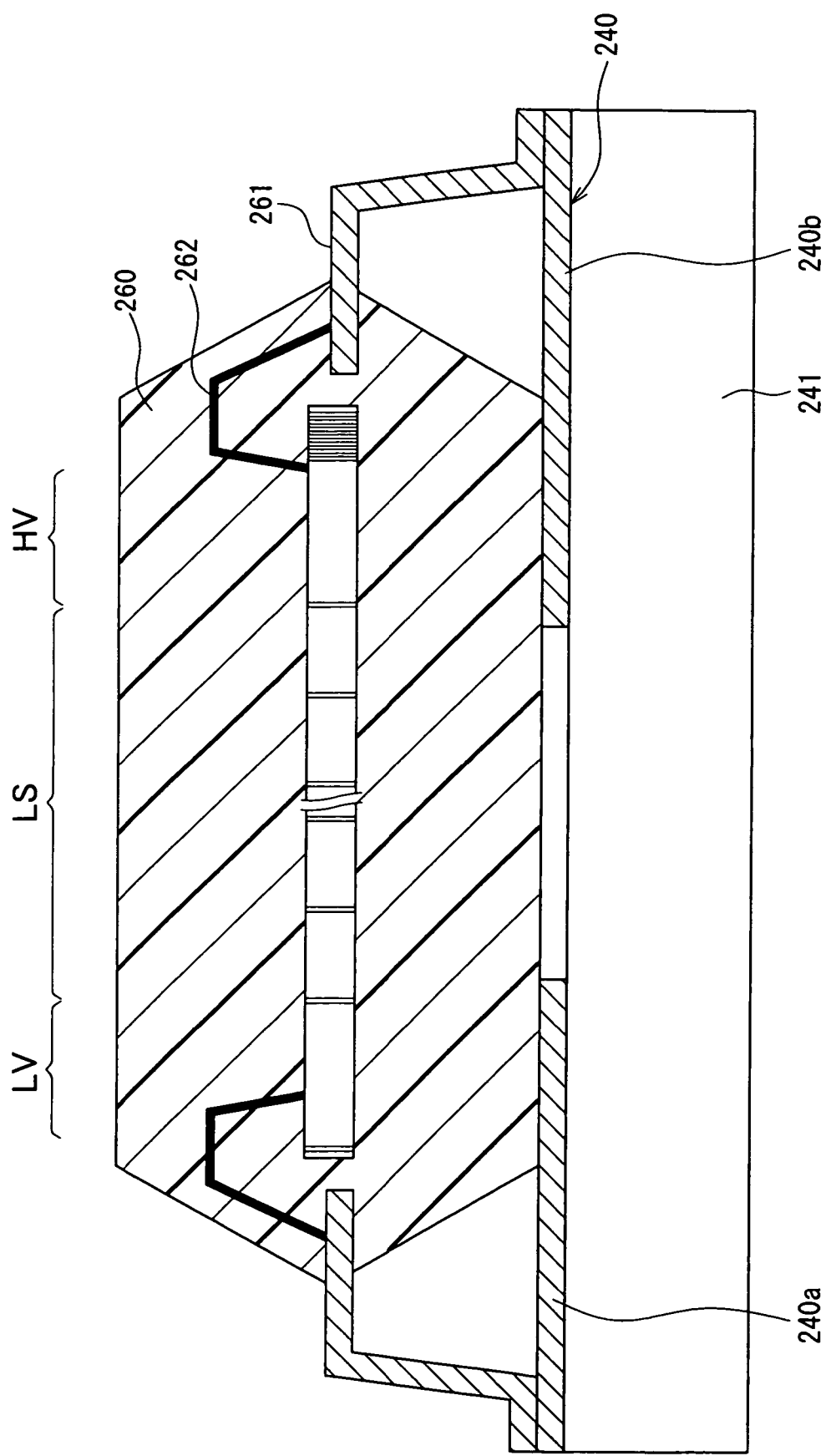
FIG. 22 is a cross sectional diagram illustrating a semiconductor apparatus in accordance with a tenth embodiment.

FIG. 22 is a cross sectional diagram illustrating the semiconductor apparatus (i.e., HVIC) in accordance with the present embodiment. As similar as in an eighth embodiment, various elements (not shown) are formed in the semiconductor layer 201 to provide elements to the low and high potential circuit parts LV, HV and the level-shifting forming part LS. The semiconductor layer 201 is encapsulated with an encapsulation resin member 260 functioning as an insulating member. Through a bonding wire 262, one end of a lead frame 261 in the encapsulation resin member 260 is electrically connected to a line to which the reference potential of the low potential reference circuit part LV is applied. Through another bonding wire 262, another end of the lead frame 261 in the encapsulation resin member 260 is electrically connected to a line to which the reference potential of the high potential reference circuit part HV is applied.

A substrate 241 having a conductive pattern 240 is located on the encapsulation resin member 260. A part of the encapsulation resin member 260 is located between the substrate 241 and the semiconductor layer 201. A portion of the lead frame 261, the portion projecting outward of the encapsulation resin member 260, is bent and joined with the conductive pattern 240. Thus, the first conductive pattern 240a is electrically connected through the lead frame 261 with the line to which the reference potential in the low potential reference circuit part LV is applied. Also, the second conductive pattern 240b is electrically connected through the lead frame 261 with the line to which the reference potential in the high potential reference circuit part HV is applied.

In the above manners, the encapsulation resin member 260 can function as an insulating member. Therefore, when the conductive pattern 240 is located opposite to the semiconductor layer 201 with respect to the part of the encapsulation resin member 260, advantages of the semiconductor apparatus of the present embodiment is substantially identical to those of the semiconductor apparatus of a sixth embodiment.

Alternatively, the semiconductor apparatus may be such that that the substrate 241 is a mounting board, which is for example a printed circuit board having a wiring pattern that function as the first and second conductive patterns 240a, 240b on a surface of the board.

Eleventh Embodiment

A semiconductor apparatus of the present embodiment uses a ceramic package as an insulating member in place of the encapsulation resin member 260 of the semiconductor apparatus of a tenth embodiment.

Figure 23:
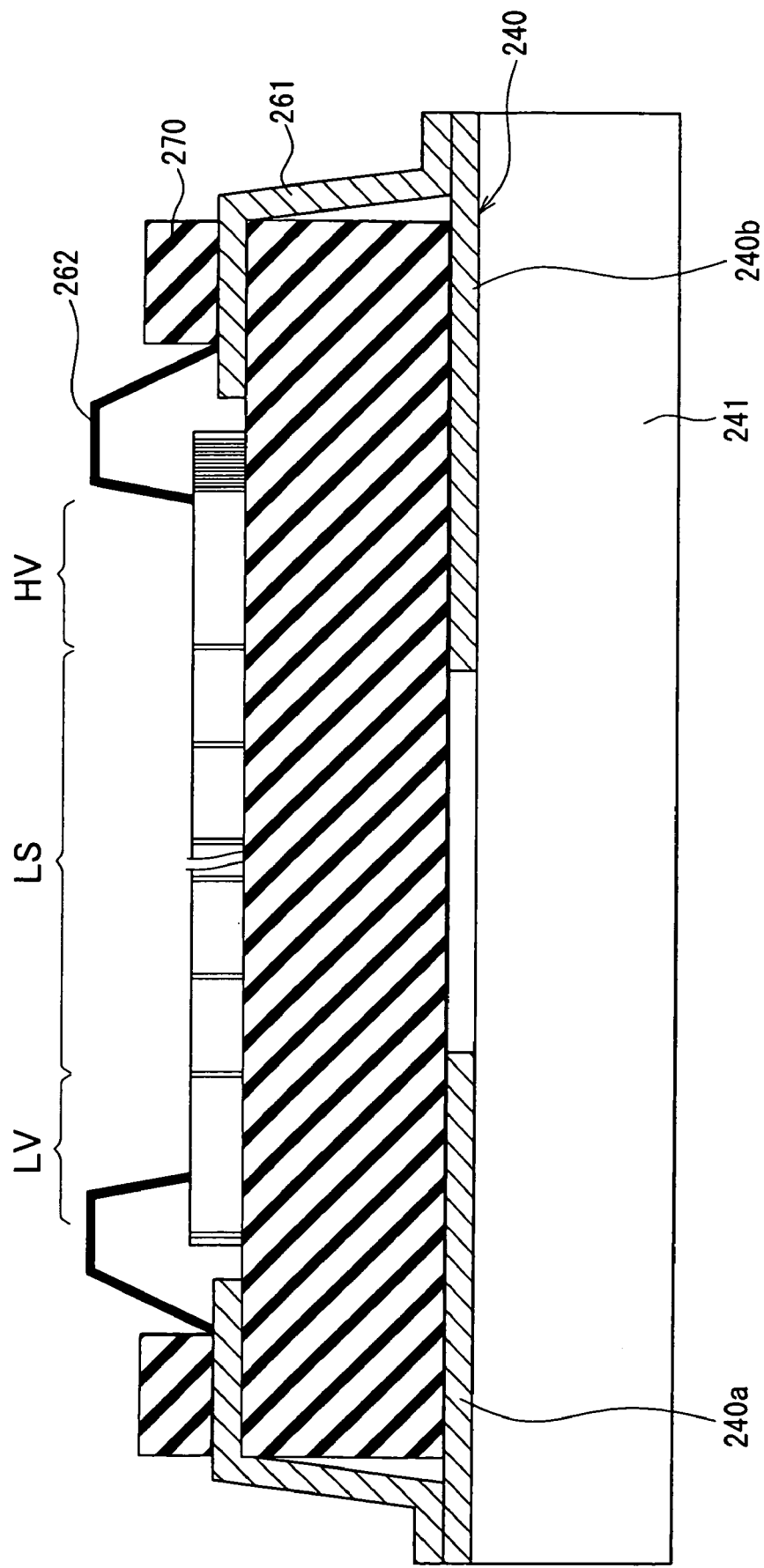
FIG. 23 is a cross sectional diagram illustrating a semiconductor apparatus in accordance with a eleventh embodiment.

FIG. 23 is a cross sectional diagram illustrating the semiconductor apparatus (i.e., HVIC) in accordance with the present embodiment. As shown in FIG. 23, a ceramic package 270 is used in place of the encapsulation resin member 260. The ceramic package 270 can function as an insulating member and has a concave portion 270a on a surface thereof. The semiconductor layer 201 is mounted inside the concave portion 270a. One end of a lead frame 261 is exposed to an inside of the concave portion 270a. A predetermined portion of the semiconductor layer 201 is electrically connected with the one end of the lead frame 261 through a bonding wire 262.

When the ceramic package 270 is used as an insulating member, the semiconductor layer 201 may be located opposite to the conductive pattern 240 with respect to the ceramic package 270. Advantages of the semiconductor apparatus of the present embodiment are substantially identical to those of the semiconductor apparatus of a sixth embodiment.

Modifications of Sixth to Eleventh Embodiments

In sixth to ninth embodiments, an exemplary element is presented for the low potential reference circuit part LV, the high potential reference circuit part HV and the level-shift element forming part LS. Alternatively, each of the parts LV, HV, LS may include an element other than or in addition to the above-described exemplary element. Further, alternatively, the semiconductor apparatus may have different arrangements of the low potential reference circuit part LV, the high potential reference circuit part HV and the level-shift element forming part LS.

In sixth to eighth, tenth, and eleventh embodiments, the semiconductor layer 201 is not provided by using an SOI substrate but provided by using a bulk substrate or an epitaxial substrate that may be formed by epitaxially growth of a silicon layer on a bulk substrate. Alternatively, in sixth to eighth, tenth and eleventh embodiments, the semiconductor layer 201 may be provided by using the SOI substrate. In a ninth embodiment, the semiconductor layer 201 is provided by using the SOI substrate. Alternatively, in a ninth embodiment, the semiconductor layer 201 may be provided using the bulk substrate or the epitaxial substrate, and further, the insulating film 250 may be formed on a rear surface of the semiconductor layer 201 that is provided using the bulk substrate or the epitaxial substrate.

In the above embodiments, the insulating member, which is the insulating substrate 202, the insulating film 250 or the like, is located on whole of the rear surface of the semiconductor layer 201. Alternatively, the insulating member may be located on parts the rear surface of the semiconductor layer 201 that respectively correspond to the low and high potential reference circuit parts LV, HV.

Figure 24:
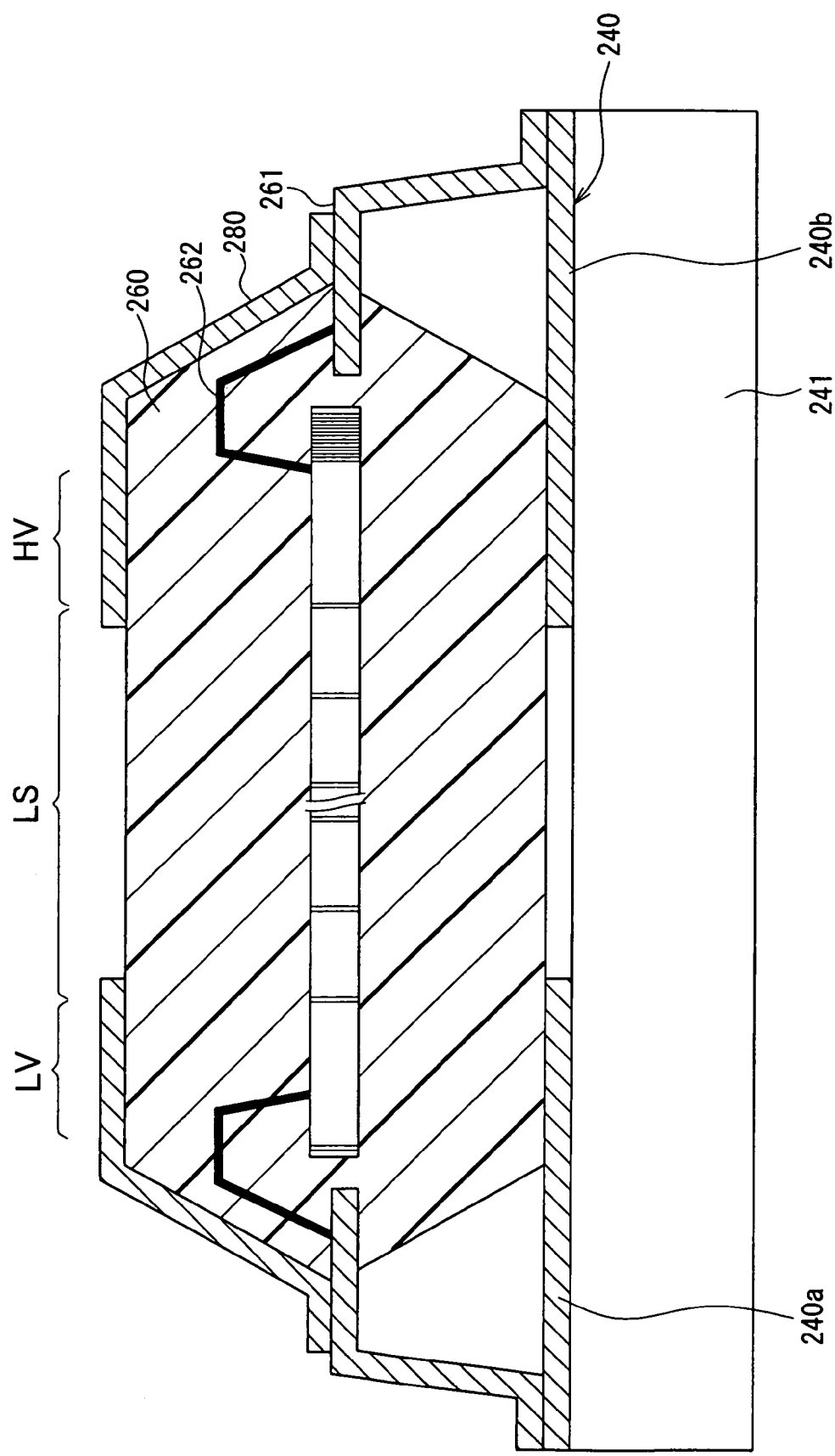
FIG. 24 is a cross sectional diagram illustrating a semiconductor apparatus in accordance with a modified embodiment.
Figure 25:
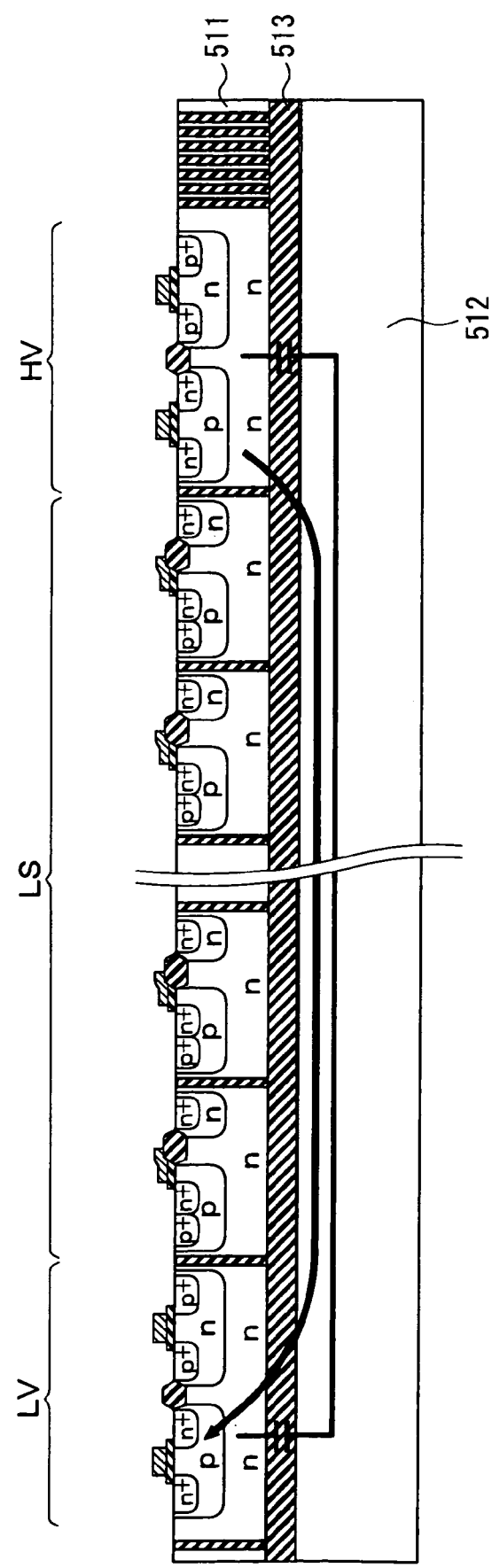
FIG. 25 is a cross sectional diagram illustrating a displacement current flow in an HVIC in accordance with the related art.

In a tenth embodiment, the encapsulation resin member 260 functions as an insulating member, and a part of the encapsulation resin member 260 is located above the semiconductor layer 201. In the above structure, there is a possibility that the encapsulation resin member 260 functions as parasitic capacitor. It may be preferable that a conductive member 280 may be disposed above the encapsulation resin member 260, as shown in FIG. 24.

According to a first aspect of the present disclosure, a semiconductor apparatus is provided. The semiconductor apparatus includes an SOI substrate 104 having an active layer 101, a buried insulation film 103 and a support substrate 102. The active layer 101 and the support substrate 102 are bonded through the buried insulation film 103. The semiconductor apparatus further includes a low potential reference circuit part LV located in the active layer 101 and operable at a first reference potential. The semiconductor apparatus further includes a high potential reference circuit part HV located in the active layer 101 and operable at a second reference potential, which is greater than or equal to the first reference potential. The semiconductor apparatus further includes a level-shifting element forming part LS located in the active layer 101 and having a level-shifting element 120 for providing a level-shift between the first reference potential and the second reference potential. The semiconductor apparatus further includes an insulation member 130 insulating a first portion and a second portion of the support substrate 102 from each other. A location of the first portion corresponds to the low potential reference circuit part LV, a location of the second portion corresponds to the high potential reference circuit part HV.

According to the above configuration, the insulation member 130 insulates the first and second portions of the support substrate 102. The first portion is located in a place corresponding to the low potential reference circuit part LV. The second portion is located in a place corresponding to the high potential reference circuit part HV. Accordingly, it is possible to restrict potential propagation between a portion below the low potential reference circuit part LV and another portion below the high potential reference circuit part HV. It is therefore possible to suppress generation of a displacement current that charges or discharges a parasitic capacitance. It is restrict a circuit improper operation.

The above semiconductor apparatus may be configured such that the insulation member 130 is made of resin, or alternatively, air or vacuum.

The above semiconductor apparatus may be configured such that: the high potential reference circuit part HV has a second region that the second reference potential is applied to; and the second portion of the support substrate 102 is electrically connected with the second region of the high potential reference circuit part HV.

According to the above configuration, the high potential reference circuit part HV and the second portion of the support substrate 102 can have a substantially same potential. That is, both sides of the buried insulation film 103 can have a substantially same potential. it is possible to more efficiently restrict generation of the displacement current.

The above semiconductor apparatus may be configured such that: the low potential reference circuit part LV has a first region that the first reference potential is applied to; and the first portion of the support substrate 102 is electrically connected with the first region of the low potential reference circuit part LV.

According to the above configuration, the low potential reference circuit part LV and the first portion of the support substrate 102 can have a substantially same potential. It is possible to more efficiently restrict generation of the displacement current.

The semiconductor apparatus may be configured such that: the level-shifting element forming part LS is located between the low potential reference circuit part LV and the high potential reference circuit part HV; and the active layer 101 has a trench insulation member 105 that surrounds the low potential reference circuit part LV, the high potential reference circuit part LV and the level-shifting element forming part LS. The semiconductor apparatus may further include: an element-outside part 150 located in the active layer 101 and located outward of the trench insulation member 105. The support substrate 102 may further have a third portion, a location of which corresponds to the element-outside part 150.

According to the above configuration, because of the presence of the third portion of the support substrate 102, strength of an exterior frame for the semiconductor apparatus can be enhanced.

The above semiconductor apparatus may be configured such that the first portion of the support substrate 102 and the third portion of the support substrate 102 are integrated, the first portion being located in a place corresponding to the low potential reference circuit part LV, the third portion being located in a place corresponding to the element-outside part 150.

The above semiconductor apparatus may be configured such that the first portion of the support substrate 102 and the third portion of the support substrate 102 are electrically connected with each other, the first portion being located in a place corresponding to the low potential reference circuit part LV, the third portion being located in a place corresponding to the element-outside part 150. The above semiconductor apparatus may be configured such that the second reference potential is variable.

According to a second aspect of the present disclosure, a semiconductor apparatus is provided. The semiconductor apparatus includes a semiconductor layer 201 having a front surface and a back surface. The semiconductor layer 201 includes: a low potential reference circuit part LV operable at a first reference potential; a high potential reference circuit part HV operable at a second reference potential, which is greater than or equal to the first reference potential; and a level-shift element forming part SV having a level-shift element 220 for providing a level-shift between the first and second reference potentials. The semiconductor apparatus further includes: an insulating member 202, 250, 260, 270 located on first and second portions of the back surface of the semiconductor layer 201, which respectively correspond to the low and high potential reference circuit parts LV, HV; a first conductive member 203a, 240a located opposite to the low potential reference circuit part LV with respect to the insulating member 202, 250, 260, 270, and electrically connected with a first region of the low potential reference circuit part LV, wherein the first reference potential is applied to the first region; and a second conductive member 203b, 240b located opposite to the high potential reference circuit part HV with respect to the insulating member 202, 250, 260, 270, and electrically connected with a second region of the high potential reference circuit part HV, wherein the second reference potential is applied to the second region.

According to the above semiconductor apparatus, the first conductive member 203a, 240a and the second conductive member 203b, 240b are arranged so as to respectively correspond to the low potential reference circuit part LV and the high potential reference circuit part HV. Thus, a portion of the insulating member 202, 250, 260, 270 located below the low potential reference circuit part LV is located between two elements having a same potential, the two elements being the low potential reference circuit part LV and the first conductive member 203a, 240a. Another portion of the insulating member 202 located below the high potential reference circuit part HV is located between two elements having a same potential, the two elements being the high potential reference circuit part HV and the second conductive member 203b, 240b.

It is hence possible to substantially eliminate a potential difference between two ends of a parasitic capacitor formed in the semiconductor apparatus. It is possible to cancel the parasitic capacitance. It is therefore possible to restrict generation of the displacement current that is caused by the dv/dt surge, and that charges and discharges the parasitic capacitance. It is possible to prevent circuit malfunction.

The above semiconductor apparatus may further include a bonding wire 204, 262 having a first bonding wire and a second bonding wire. The first bonding wire electrically connects the first conductive member 203a, 240a to the first region of the low potential reference circuit part LV. The second bonding wire electrically connects the second conductive member 203b, 240b to the second region of the high potential reference circuit part HV.

The above semiconductor apparatus may be configured such that: the insulating member 202, 250, 260, 270 has a first trench and a first penetration electrode 230 embedded in the first trench; the first penetration electrode 230 electrically connects the first conductive member 203a, 240a to the first region of the low potential reference circuit part LV; the insulating member 202, 250, 260, 270 further have a second trench and a second penetration electrode 230 embedded in the second trench; and the second penetration electrode 230 electrically connects the second conductive member 203b, 240b to the second region of the high potential reference circuit part HV.

The above semiconductor apparatus may further include a lead frame (203) for external electrical connection of the low and high potential reference circuit parts (LV, HV). The lead frame (203) includes the first and second conductive members (203a, 240a, 203b, 240b).

The above semiconductor apparatus may further include a substrate (241) located opposite to the semiconductor layer (201) with respect to the insulating member (202, 250, 260, 270), the substrate 241 having a first conductive pattern (240a) and a second conductive pattern (240b). The first and second conductive patterns (240a, 240b) respectively include the first and second conductive members (203a, 240a, 203b, 240b).

The above semiconductor apparatus may further include an encapsulation resin member 260 encapsulating the semiconductor layer 201 and including the insulating member 202, 250, 260, 270. The above semiconductor apparatus may further include a first lead frame 261 and a second lead frame 261. A first end of the first lead frame 261 may be located inside the encapsulation resin member 260 and electrically connected with the first region of the low potential reference circuit part LV. A second end of the first lead frame 261 may be electrically connected with the first conductive pattern 240a of the substrate 241. A first end of the second lead frame 261 is located inside the encapsulation resin member 260 and electrically connected with the second region of the high potential reference circuit part HV. A second end of the second lead frame 261 is electrically connected with the second conductive pattern 240b of the substrate 241.

The above semiconductor apparatus may be configured such that the insulating member 202, 250, 260, 270 is included in a ceramic package 270 onto which the semiconductor layer 201 is mounted. The above semiconductor apparatus may further include a first lead frame 261 and a second lead frame 261. The ceramic package 270 may have a concave portion into which the semiconductor layer 201 is mounted. One end of the first lead frame 261 may project from the concave portion of the ceramic package 270 and be electrically connected with the first region of the low potential reference circuit part LV. Another end of the first lead frame 261 may project from the ceramic package 270 and be electrically connected with the first conductive pattern 240a of the substrate 241. One end of the second lead frame 261 may project from the concave portion of the ceramic package 270 and be electrically connected with the second region of the high potential reference circuit part HV. Another end of the second lead frame 261 may project from the ceramic package 270 and be electrically connected with the second conductive pattern 240b of the substrate 241.

The above semiconductor apparatus may be configured such that the insulating member 202, 250, 260, 270 is provided by one of an insulating substrate 202 and an insulating film 250. The above semiconductor apparatus may be configured such that the second reference potential is variable.

While the invention has been described above with reference to various embodiments thereof, it is to be understood that the invention is not limited to the above described embodiments and construction. The invention is intended to cover various modification and equivalent arrangements. In addition, while the various combinations and configurations described above are contemplated as embodying the invention, other combinations and configurations, including more, less or only a single element, are also contemplated as being within the scope of embodiment.

What is claimed is:

1. A semiconductor apparatus comprising:
    an SOI substrate including an active layer, a support substrate and a buried insulation film, wherein the active layer and the support substrate are bonded to each other via the buried insulation film therebetween;
    a low potential reference circuit part located in the active layer and operable at a first reference potential;
    a high potential reference circuit part located in the active layer and operable at a second reference potential, which is greater than or equal to the first reference potential;
    a level-shifting element forming part located in the active layer and having a level-shifting element providing a level-shift between the first reference potential and the second reference potential; and
    an insulation member insulating a first portion and a second portion of the support substrate from each other, wherein the first portion corresponds in location to the low potential reference circuit part, wherein the second portion corresponds in location to the high potential reference circuit part, wherein:
    the low potential reference circuit part has a first region to which the first reference potential is applied; and
    the first portion of the support substrate is electrically connected with the first region of the low potential reference circuit part.

2. The semiconductor apparatus according to claim 1, wherein
    the insulation member is made of resin.

3. The semiconductor apparatus according to claim 1, wherein
    the insulation member is air.

4. The semiconductor apparatus according to claim 1, wherein
    the insulation member is vacuum.

5. The semiconductor apparatus according to claim 1, wherein:
    the high potential reference circuit part has a second region to which the second reference potential is applied; and
    the second portion of the support substrate is electrically connected with the second region of the high potential reference circuit part.

6. The semiconductor apparatus according to claim 5, wherein:
    the low potential reference circuit part has a first region to which the first reference potential is applied; and
    the first portion of the support substrate is electrically connected with the first region of the low potential reference circuit part.

7. The semiconductor apparatus according to claim 1, wherein:
    the second reference potential is variable.

8. The semiconductor apparatus according to claim 1, wherein:
    the level-shifting element forming part is located between the low potential reference circuit part and the high potential reference circuit part; and
    the active layer has a trench insulation member that surrounds the low potential reference circuit part, the high potential reference circuit part and the level-shifting element forming part;
    the semiconductor apparatus according to claim 1 further comprising:
    an element-outside part located in the active layer and located outward of the trench insulation member, wherein the support substrate further has a third portion, wherein the third portion corresponds in location to the element-outside part.

9. The semiconductor apparatus according to claim 8, wherein:
    the first portion and the third portion of the support substrate are integrated.

10. The semiconductor apparatus according to claim 8, wherein:
    the first portion and the third portion of the support substrate are electrically connected with each other.

11. A semiconductor apparatus comprising:
    a semiconductor layer having a front surface and a back surface, the semiconductor layer including:
    a low potential reference circuit part operable at a first reference potential;
    a high potential reference circuit part operable at a second reference potential, which is greater than or equal to the first reference potential; and
    a level-shift element forming part having a level-shift element providing a level-shift between the first and second reference potentials;
    an insulating member located on a first portion and a second portion of the back surface of the semiconductor layer, the first and second portions respectively correspond to the low and high potential reference circuit parts;
    a first conductive member located opposite to the low potential reference circuit part with respect to the insulating member, and electrically connected with a first region of the low potential reference circuit part, wherein the first reference potential is applied to the first region; and
    a second conductive member located opposite to the high potential reference circuit part with respect to the insulating member, and electrically connected with a second region of the high potential reference circuit part, wherein the second reference potential is applied to the second region.

12. The semiconductor apparatus according to claim 11, further comprising:
    a bonding wire having a first bonding wire and a second bonding wire, wherein:
    the first bonding wire electrically connects the first conductive member to the first region of the low potential reference circuit part; and
    the second bonding wire electrically connects the second conductive member to the second region of the high potential reference circuit part.

13. The semiconductor apparatus according to claim 11, wherein:
    the insulating member has a first trench and a first penetration electrode embedded in the first trench;
    the first penetration electrode electrically connects the first conductive member to the first region of the low potential reference circuit part;
    the insulating member further have a second trench and a second penetration electrode embedded in the second trench; and the second penetration electrode electrically connects the second conductive member to the second region of the high potential reference circuit part.

14. The semiconductor apparatus according to claim 11, further comprising:
a lead frame having a first lead frame and a second lead frame, wherein
the first conductive member is a first lead frame for external electrical connection of the low potential reference circuit part; and
the second conductive member is a second lead frame for external electrical connection of the high potential reference circuit part.

15. The semiconductor apparatus according to claim 11, wherein
the insulating member is one of an insulation substrate and an insulating film.

16. The semiconductor apparatus according to claim 11, wherein
the second reference potential is variable.

17. The semiconductor apparatus according to claim 11, further comprising:
a substrate located opposite to the semiconductor layer with respect to the insulating member, and having a first conductive pattern and a second conductive pattern, wherein:
the first conductive member is the first conductive pattern; and,
the second conductive member is the second conductive pattern.

18. The semiconductor apparatus according to claim 17, wherein:
the insulating member is an encapsulation resin member encapsulating the semiconductor layer.

19. The semiconductor apparatus according to claim 18, further comprising:
first and second lead frames, wherein:
a first end of the first lead frame is located inside the encapsulation resin member and electrically connected with the first region of the low potential reference circuit part;
a second end of the first lead frame is electrically connected with the first conductive pattern of the substrate;
a first end of the second lead frame is located inside the encapsulation resin member and electrically connected with the second region of the high potential reference circuit part; and
a second end of the second lead frame is electrically connected with the second conductive pattern of the substrate.

20. The semiconductor apparatus according to claim 17, wherein:
the insulating member is a ceramic package onto which the semiconductor layer is mounted.

21. The semiconductor apparatus according to claim 20, further comprising:
first and lead frames, wherein:
the ceramic package has a concave portion into which the semiconductor layer is mounted;
one end of the first lead frame projects from the concave portion of the ceramic package and is electrically connected with the first region of the low potential reference circuit part;
another end of the first lead frame projects from the ceramic package and is electrically connected with the first conductive pattern;
one end of the second lead frame projects from the concave portion of the ceramic package and is electrically connected with the second region of the high potential reference circuit part; and
another end of the second lead frame projects from the ceramic package and is electrically connected with the second conductive pattern.

22. A semiconductor apparatus comprising:
an SOI substrate including an active layer, a support substrate and a buried insulation film, wherein the active layer and the support substrate are bonded to each other via the buried insulation film therebetween;
a low potential reference circuit part located in the active layer and operable at a first reference potential;
a high potential reference circuit part located in the active layer and operable at a second reference potential, which is greater than or equal to the first reference potential;
a level-shifting element forming part located in the active layer and having a level-shifting element providing a level-shift between the first reference potential and the second reference potential; and
an insulation member insulating a first portion and a second portion of the support substrate from each other, wherein
the first portion corresponds in location to the low potential reference circuit part,
the second portion corresponds in location to the high potential reference circuit part,
the low potential reference circuit part has a first region to which the first reference potential is applied,
the high potential reference circuit part has a second region to which the second reference potential is applied, and
the second portion of the support substrate is electrically connected with the second region of the high potential reference circuit part.

* * * * *